United States Patent
Clegg et al.

(10) Patent No.: US 10,037,970 B2
(45) Date of Patent: Jul. 31, 2018

(54) MULTIPLE INTERCONNECTIONS BETWEEN DIE

(71) Applicant: FREESCALE SEMICONDUCTOR, INC., Austin, TX (US)

(72) Inventors: David Clegg, Austin, TX (US); James S. Golab, Austin, TX (US); Trent Uehling, Austin, TX (US); Tingdong Zhou, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/259,980

(22) Filed: Sep. 8, 2016

(65) Prior Publication Data

US 2018/0068980 A1 Mar. 8, 2018

(51) Int. Cl.
| | |
|---|---|
| H01L 23/48 | (2006.01) |
| H01L 23/52 | (2006.01) |
| H01L 29/40 | (2006.01) |
| H01L 25/065 | (2006.01) |
| H01L 23/00 | (2006.01) |
| H01L 23/31 | (2006.01) |
| H01L 21/56 | (2006.01) |
| H01L 21/683 | (2006.01) |

(52) U.S. Cl.
CPC ........ *H01L 25/0655* (2013.01); *H01L 21/563* (2013.01); *H01L 21/6835* (2013.01); *H01L 23/3128* (2013.01); *H01L 24/03* (2013.01); *H01L 24/09* (2013.01); *H01L 24/11* (2013.01); *H01L 24/17* (2013.01); *H01L 24/43* (2013.01); *H01L 24/49* (2013.01); *H01L 24/73* (2013.01); *H01L 24/85* (2013.01); *H01L 2221/68354* (2013.01); *H01L 2224/04042* (2013.01)

(58) Field of Classification Search
CPC . H01L 2224/73265; H01L 2224/48227; H01L 2224/97; H01L 24/48; H01L 24/45; H01L 24/85
USPC ........ 257/784, 778, 723, 724; 438/107, 108, 438/110
See application file for complete search history.

(56) References Cited

U.S. PATENT DOCUMENTS

| | | | |
|---|---|---|---|
| 5,723,906 A | 3/1998 | Rush | |
| 7,427,535 B2 | 9/2008 | Vaiyapuri | |
| 7,554,185 B2 | 6/2009 | Foong et al. | |
| 7,786,572 B2 | 8/2010 | Chen | |
| 8,084,853 B2 | 12/2011 | Hsieh | |
| 2002/0005576 A1* | 1/2002 | Sakamoto | H01L 21/4828 257/687 |
| 2007/0023921 A1* | 2/2007 | Zingher | H01L 23/48 257/778 |
| 2009/0273098 A1* | 11/2009 | Bartley | H01L 23/5386 257/778 |
| 2011/0193243 A1 | 8/2011 | Gupta et al. | |
| 2012/0220056 A1* | 8/2012 | Shi | H01L 23/13 438/3 |

* cited by examiner

Primary Examiner — S. V. Clark

(57) ABSTRACT

Embodiments of a semiconductor packaged device and method of making thereof are provided, the device including a substrate; a first flip chip die mounted to a first major surface of the substrate; a second flip chip die mounted to the first major surface of the substrate, the second flip chip die laterally adjacent to the first flip chip die on the first major surface; and a wire bond formed between a first bond pad on the first flip chip die and a second bond pad on the second flip chip die.

20 Claims, 12 Drawing Sheets

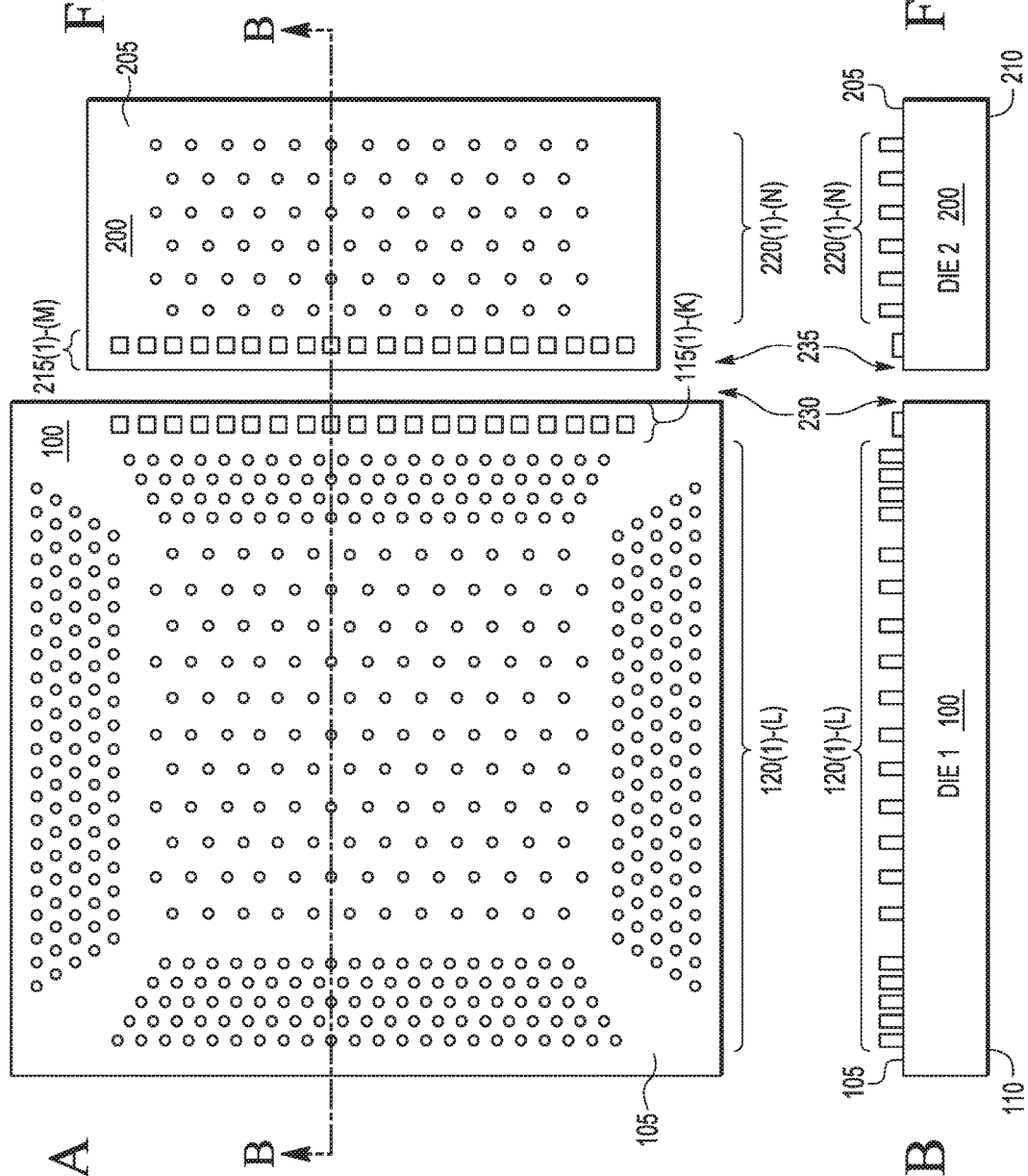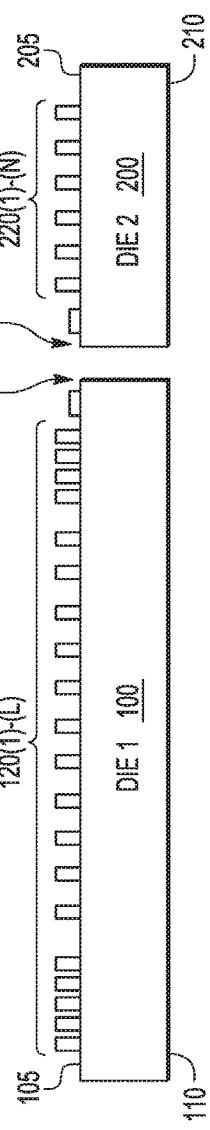

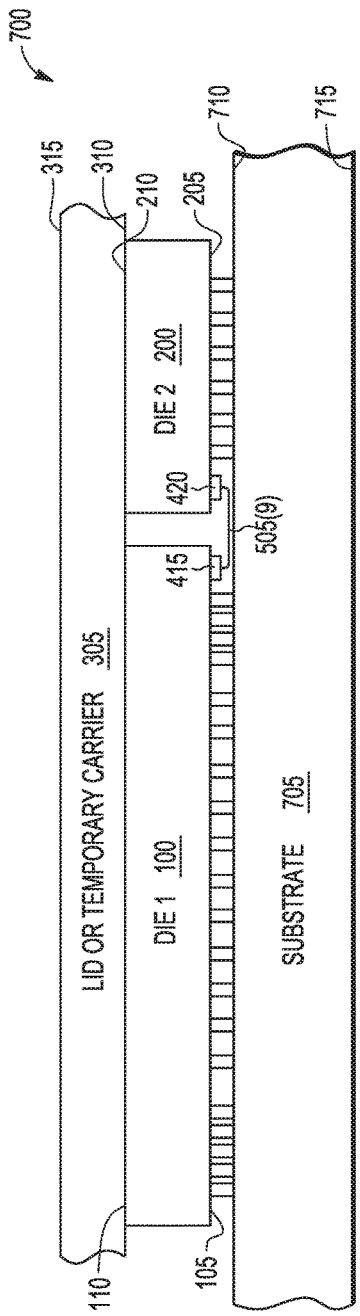
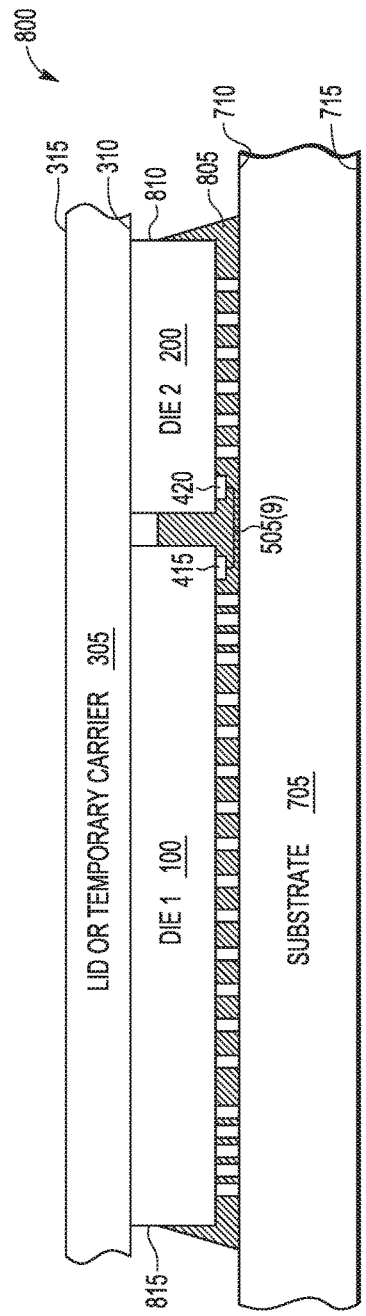

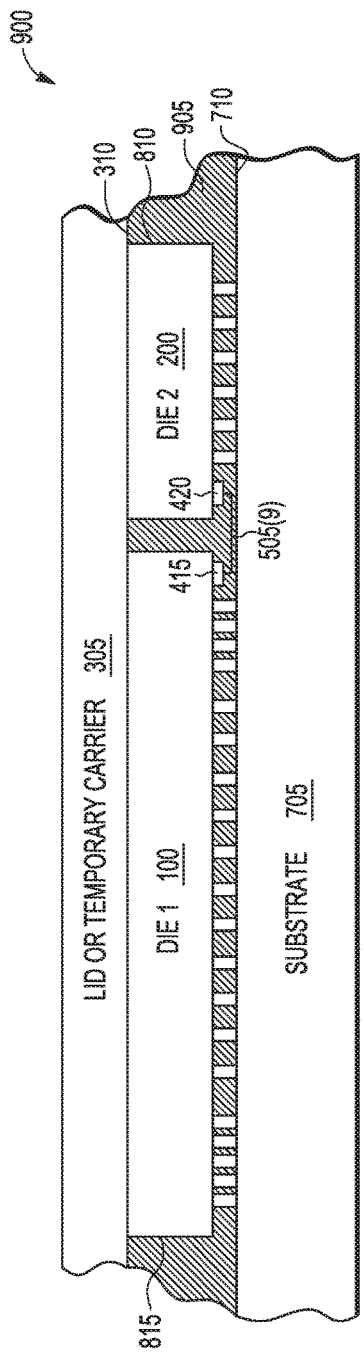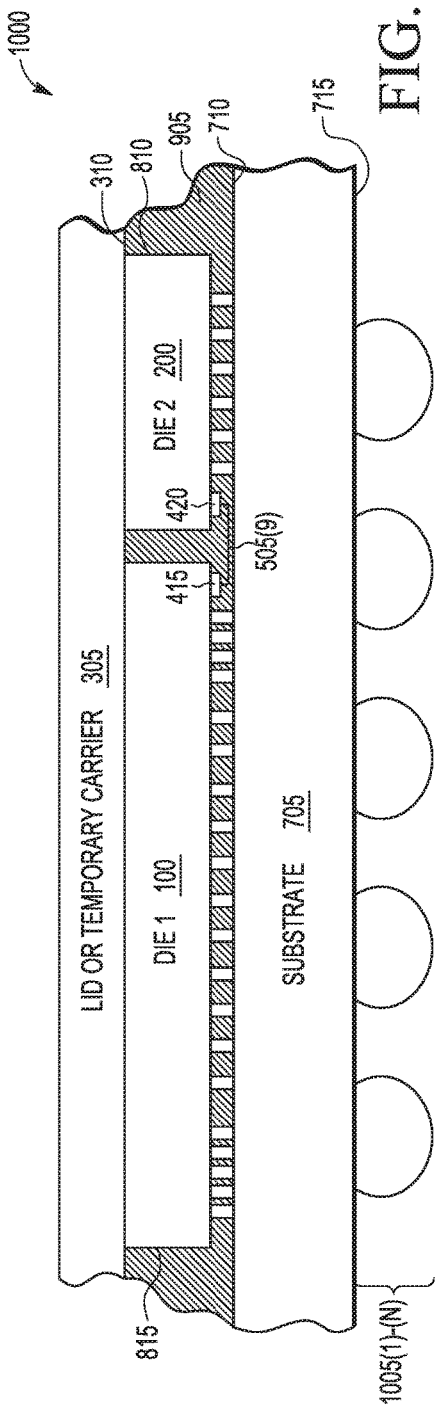

MULTIPLE INTERCONNECTIONS BETWEEN DIE

BACKGROUND

Field

This disclosure relates generally to semiconductor packages including multiple die, and more specifically, to interconnections between multiple die of a semiconductor package.

Related Art

Higher performance, lower costs, increased miniaturization of components, and greater packaging density of integrated circuits are ongoing goals of the semiconductor industry. Obtaining greater integrated circuit density is primarily limited by the space or "real estate" available for mounting die on a substrate, especially when multiple die are mounted. Known packaging technologies provide for simple flip chip attachment of one or more die to a substrate or wire bond attachment of one or more die to a substrate.

The number of connections between adjacent die in the same package are limited by package design rules and less so by die design rules, which govern minimum pad, line, or space widths. One approach for increasing the number of connections between adjacent die, such as between flip chip die attached to a substrate, is adding substrate layers to implement connections through the substrate between the die, which increases cost.

BRIEF DESCRIPTION OF THE DRAWINGS

The present invention may be better understood, and its numerous objects, features, and advantages made apparent to those skilled in the art by referencing the accompanying drawings.

FIGS. 1A, 1B, 2A, and 2B illustrate block diagrams depicting example die after bumping and singulation, according to some embodiments of the present disclosure.

FIG. 7 illustrates a block diagram depicting an example semiconductor device after flipping and reflowing to a substrate, according to some embodiments of the present disclosure.

FIGS. 8 and 9 illustrate block diagrams depicting example semiconductor devices after differing encapsulation processes, according to some embodiments of the present disclosure.

FIG. 10 illustrates a block diagram depicting an example semiconductor device after solder ball attachment, according to some embodiments of the present disclosure.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

Figure 3:
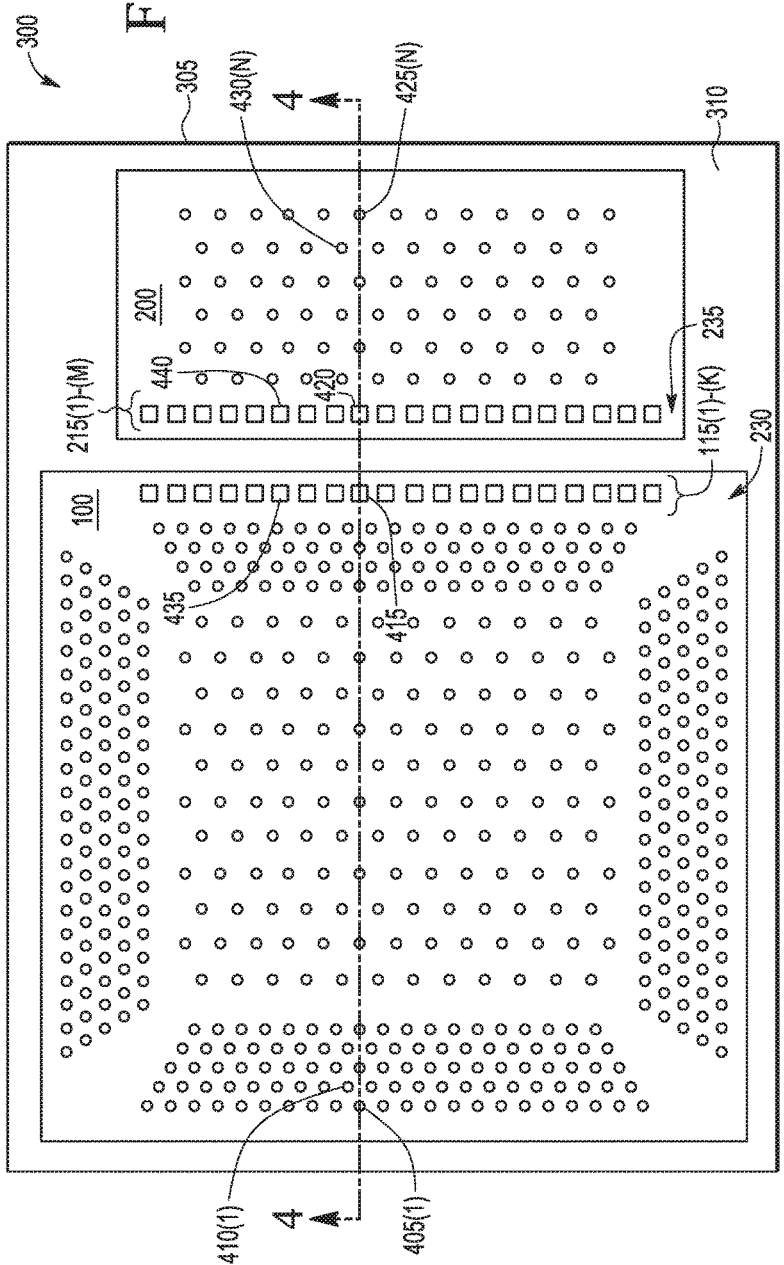
FIGS. 3 and 4 illustrate block diagrams depicting an example semiconductor device after attachment of die to a lid or temporary carrier, according to some embodiments of the present disclosure.

The following sets forth a detailed description of various embodiments intended to be illustrative of the invention and should not be taken to be limiting.

Overview

The present disclosure provides for the formation of wire bond interconnects between two or more adjacent flip chip die that are attached to a lid or temporary carrier. This structure, including the die and wire bond interconnects, is then inverted and the die are flip chip bonded to a flip chip package substrate. The flip chip package substrate may include additional substrate interconnects formed between the two or more flip chip die. The wire bond interconnects provide additional high density, high speed interconnects between die without requiring additional package substrate layers.

Example Embodiments

FIG. 1A shows a top down view of an example first semiconductor die 100 (also referred to simply as die 100). Die 100 includes active circuitry, such as IP (Intellectual Property or specialized) circuitry, located on an active side 105 of the die 100, as further shown in FIG. 19. Die 100 is one of a plurality of semiconductor die fabricated as part of a semiconductor wafer, where each die includes a number of bonding pads on active side 105. After the wafer is fabricated, a plurality of flip chip bumps are formed on a subset of the bonding pads on each die of the wafer by a bumping process, and die 100 is singulated from the plurality of dies.

As shown in FIG. 1A, active side 105 of die 100 includes a plurality of flip chip bumps 120(1)-(L), where the bumps are formed on or joined to a first set of bonding pads of die 100, which may also be referred to as a plurality of bumped bonding pads 120(1)-(L). The bumped bonding pads 120(1)-(L) will be used to form flip chip connections with a substrate, some of which may be used to implement a set of flip chip interconnects for die to die communication in some embodiments, as further discussed below. For simplicity's sake, each bump and its respective underlying bonding pad are illustrated as a single entity in the Figures herein, such as a circle in top down views and as a tall rectangle in cross-sectional views. Die 100 also includes a second set of bonding pads 115(1)-(K) that are not bumped (i.e., the bumping process performed on the wafer does not form bumps on pads 115(1)-(K) of die 100), which are also referred to as a plurality of wire bonding pads 115(1)-(K). The wire bonding pads 115(1)-(K) will be used to form a number of wire bond interconnects for die to die communication, as further discussed below. Each wire bonding pad is shown as a square in top down views and as a short rectangle in cross-sectional views.

FIG. 1B shows a cross-sectional view of die 100 at line B, which has active side 105 oriented in an upward direction (e.g., face up). Die 100 also has a back side 110 that is opposite active side 105. It is noted that the cross-sectional view of die 100 shows both the bumped bonding pads 120 that are directly intersected by line B, as well as the staggered or off-set bumped bonding pads 120 that are in the immediate next row in the direction of the cross-sectional view (shown by the arrows). In other words, every other bumped bonding pad 120 shown in FIG. 1B are in different neighboring rows, as further discussed below in connection with FIGS. 3 and 4.

In the embodiment shown, bumped bonding pads 120(1)-(L) are arranged in an array of rows and columns across active side 105, while wire bonding pads 115(1)-(K) are arranged in a single row on active side 105 near an edge of die 100, also referred to as a die to die communication edge 230 or communication edge 230 or simply edge 230. In the embodiment shown, die 100 has a single communication edge 230, although die 100 may have multiple communication edges 230 in other embodiments, as further discussed below in connection with FIG. 17. In other embodiments, wire bonding pads may be arranged in different arrangements, such as in multiple rows, along each communication edge 230, such as that shown in FIG. 12. The bumped bonding pads may be in any arrangement as needed for the application of die 100, which may include symmetrical and asymmetrical arrangements, centered and off-centered or staggered arrangements, fully populated arrangements and arrangements that include non-populated areas.

The number of wire bonding pads in a single row need not equal the number of bumped bonding pads in a row parallel or perpendicular to the single row. In some embodiments, the diameter of the wire bonding pads are substantially equal to the diameter of the bumped bonding pads. In other embodiments, the diameter of the wire bonding pads are smaller than the diameter of the bumped bonding pads in order to accommodate the smallest possible interface. In other embodiments, the diameter of the wire bonding pads are larger than the diameter of the bumped bonding pads in order to accommodate wire bond formation that requires a larger target pad. In some embodiments, the spacing or pitch between wire bonding pads may be substantially equal to the spacing or pitched between bumped bonding pads, while in other embodiments, the spacing or pitch between wire bonding pads may be larger than the spacing or pitch between bumped bonding pads. In other embodiments, the spacing or pitch between wire bonding pads may be smaller than the spacing or pitch between bumped bonding pads. In the embodiments discussed herein, bonding pads are formed on die 100 using common process steps during wafer fabrication, resulting in the bonding pads underlying the flip chip bumps and the wire bonding pads each having a substantially same height measured from active side 105 to the top of each bonding pad. In other embodiments, the bonding pads underlying the flip chip bumps and the wire bonding pads have different heights measured from active side 105 to the top of each bonding pad. While the bonding pads on die 100 are illustrated as circles and squares to indicate the two types of bonding pads (bumped bonding pads and wire bonding pads), some embodiments provide that the two types of bonding pads each have a substantially same uniform shape, such as both types of bonding pads being circular, polygonal, or the like. In other embodiments, the two types of bonding pads are differently shaped from one another, such as one type being circular and the other type being polygonal.

Examples of flip chip bumps 120(1)-(L) include, but are not limited to, C4 bumps, balls, pillars, studs, and the like. Flip chip bumps 120(1)-(L) are made from a conductive material, examples of which include, but are not limited to, solder, copper, gold, nickel, aluminum, alloys of such metals, or other suitable conductive material or combination of materials. The bonding pads of die 100 (including the bonding pads on which flip chip bumps 120(1)-(L) are formed and the wire bonding pads 115(1)-(K)) are also made from a conductive material, examples of which include, but are not limited to, copper, gold, nickel, aluminum, alloys of such metals, or other suitable conductive material or combination of materials. Flip chip bumps 120(1)-(L) may be made of the same conductive material or may be made of a different conductive material than the bonding pads on which the bumps 120 are formed. It is noted that other details have been omitted from the Figures herein that are well known in the art, such as a passivation layer formed in between the bonding pads and a metallization layer or wettable coating formed on each bonding pad of die 100.

The active circuitry or IP circuitry may be implemented using integrated circuit (IC) components, examples of which include but are not limited to a processor, memory, logic, analog circuitry, sensor, MEMS (microelectromechanical systems) device, a standalone discrete device such as a resistor, inductor, capacitor, diode, power transistor, and the like. In some embodiments, the active circuitry may be a combination of the integrated circuit components listed above or may be another type of microelectronic device.

As noted above, die 100 is one of a plurality of semiconductor die fabricated as part of a semiconductor wafer using a sequence of process steps, also referred to as wafer fabrication. The semiconductor wafer, and thus the plurality of dies including die 100, described herein can be any semiconductor material or combinations of materials, such as gallium arsenide, silicon germanium, silicon-on-insulator (SOI), silicon, monocrystalline silicon, the like, and combinations of the above. Example wafer fabrication process steps include but are not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like. Bumping includes the formation of the flip chip bumps on a subset of the bonding pads on die 100, such as by deposition of conductive material on the subset of bonding pads or placement of preforms and reflowing to join with the subset of bonding pads. Die singulation includes separation of die 100 from the plurality of die by the use of one or more of a saw, a laser, etchant(s), and the like. In some embodiments, the wafer may be otherwise processed and thinned prior to die singulation.

FIG. 2A shows a top down view of an example second semiconductor die 200 (also referred to simply as die 200). Die 200 includes active circuitry, such as IP circuitry, located on active side 205 of the die 200, as also further shown in FIG. 19. Die 200 is one of a plurality of semiconductor die fabricated as part of a semiconductor wafer. In the embodiment shown herein, die 200 is one of a second plurality of dies that are fabricated as part of a second wafer, where each die includes a number of bonding pads on active side 205. After the second wafer is fabricated, a plurality of flip chip bumps are formed on a subset of the bonding pads on each die of the second wafer by a bumping process, and die 200 is singulated from the second plurality of dies.

As shown in FIG. 2A, active side 205 of die 200 includes a plurality of flip chip bumps 220(1)-(N), where the bumps are formed on a first set of bonding pads of die 200, which may also be referred to as a plurality of bumped bonding pads 220(1)-(N). The bumped bonding pads 220(1)-(N) will be used to form flip chip connections with a substrate, some of which may be used to implement a set of flip chip interconnects for die to die communication in some embodiments, as further discussed below. Die 200 also includes a second set of bonding pads 215(1)-(M) that are not bumped (i.e., the bumping process performed on the second wafer does not form bumps on pads 215(1)-(M) of die 200), which are also referred to as a plurality of wire bonding pads 215(1)-(M). The wire bonding pads 215(1)-(M) will be used to form a number of wire bond interconnects for die to die communication, as further discussed below. The bonding pads of die 200 are shown in the Figures in a similar manner as the bonding pads of die 100, as noted above.

FIG. 2B shows a cross-sectional view of die 200 at line B, which has active side 205 oriented in an upward direction (e.g., face up). Die 200 also has a back side 210 that is opposite active side 205. It is noted that the cross-sectional view of die 200 shows both the bumped bonding pads 220 that are directly intersected by line B, as well as the staggered or off-set bumped bonding pads 220 that are in the immediate next row in the direction of the cross-sectional view (shown by the arrows). In other words, every other bumped bonding pad 220 shown in FIG. 2B are in different neighboring rows, as further discussed below in connection with FIGS. 3 and 4.

In the embodiment shown, bumped bonding pads 220(1)-(N) are arranged in an array of rows and columns across active side 205, while wire bonding pads 215(1)-(M) are arranged in a single row on active side 105 near an edge of die 200, also referred to as a die to die communication edge 235 or communication edge 235 or simply edge 235. In the embodiment shown, die 200 has a single communication edge 235, although die 200 may have multiple communication edges 235 in other embodiments, as further discussed below in connection with FIG. 17.

The bumped bonding pads 220(1)-(N) may be in any arrangement across active side 205, and wire bonding pads 215(1)-(M) may be arranged in one or more rows or other arrangement on each communication edge 235, as similarly discussed above. The number of wire bonding pads 215(1)-(M) need not equal the number of wire bonding pads 115(1)-(K) on die 100, and the number of bumped bonding pads 220(1)-(N) need not equal the number of bumped bonding pads 120(1)-(L) on die 100, as indicated by the different integer variables K, L, M, and N. In the embodiment shown, the number of wire bonding pads 115(1)-(K) and 215(1)-(M) are equal, while the number is different in another embodiment discussed below in connection with FIG. 11.

It is noted that the discussion provided above regarding the diameter, the spacing or pitch, the height, and the shape of the wire bonding pads and bumped bonding pads of die 100 is also applicable to wire bonding pads and bonding pads of die 200. Examples of the materials and processes used to form flip chip bumps 220(1)-(N), bonding pads of die 100 (including both the bonding pads on which flip chip bumps 220(1)-(N) are formed and wire bonding pads 215(1)-(M)), active or IP circuitry, and die 200 itself are similar to those discussed above.

While the terms "first" and "second" are used herein to discuss how two different and separate die 100 and 200 are interconnected according to the present disclosure, the terms "first" and "second" do not necessarily indicate a specific ordered relationship between the first and second die. The relationship between the first and second die may include, but is not limited to, a master and slave relationship, a parent and child relationship, a primary and auxiliary relationship, a sibling to sibling relationship, or other relationship with either die being in either role. Further, while the first die appears to be larger than the second die in the drawings, the first and second die need not be limited to such physical dimensions and may in fact be differently sized with either die being larger than the other, as well as similarly sized in other embodiments.

Figure 19:
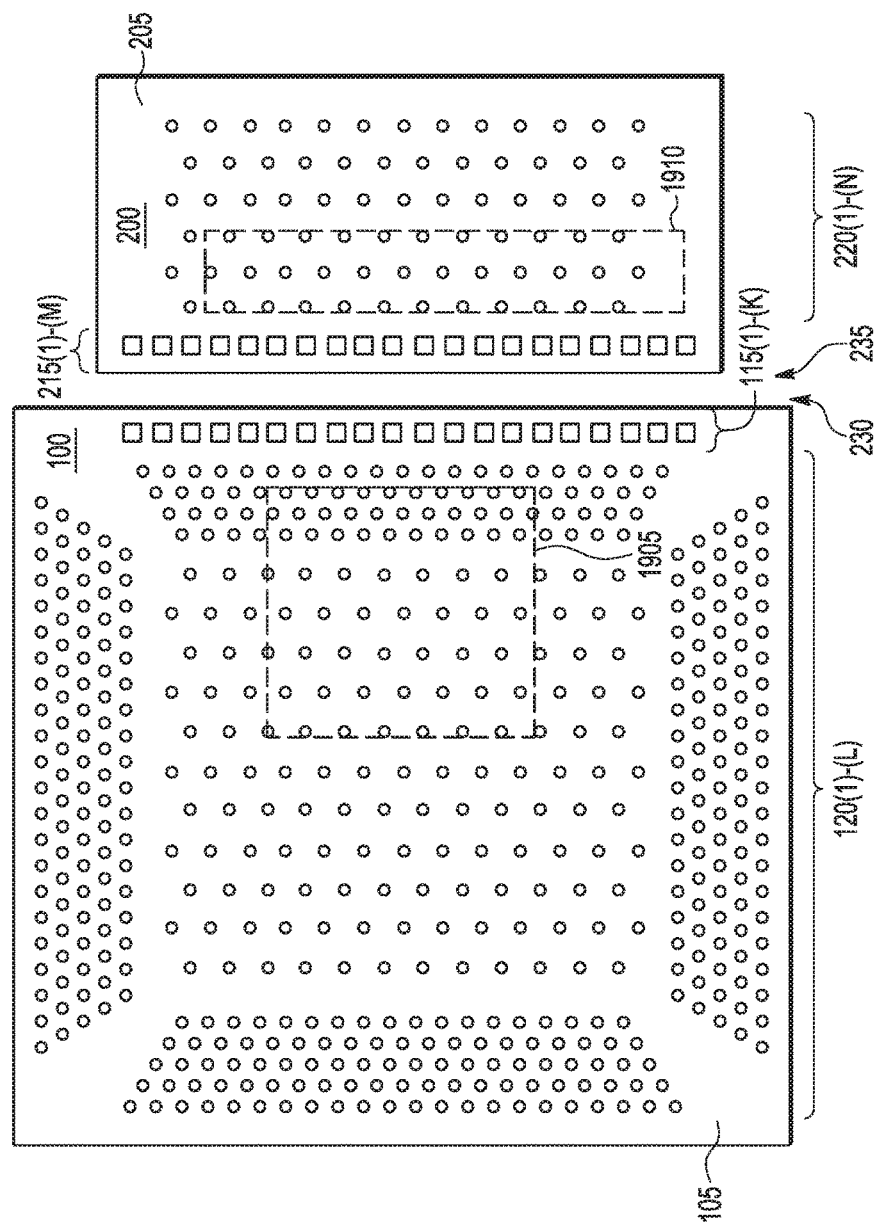
FIG. 19 illustrates a block diagram depicting example locations of an IP (Intellectual Property) circuitry on die, according to some embodiments of the present disclosure.

FIG. 19 shows a top down view of die 100 and die 200 that each includes active circuitry such as IP (Intellectual Property) circuitry, which is formed under active sides 105 and 205, respectively. An example location of a footprint or outer perimeter 1905 of active or IP circuitry that underlies active side 105 is illustrated in FIG. 19 as a box having broken lines. Similarly, an example location of a footprint or perimeter 1910 of active or IP circuitry that underlies active side 205 is also illustrated as a box having broken lines. While it is preferred that active or IP circuitry of die 100 and die 200 be located in close proximity to communication edges 230 and 235 in some embodiments (e.g., to provide shorter distances for die to die communication, thereby improving the speed of the interconnects), it is noted that active or IP circuitry of die 100 and die 200 may be in any location underlying active sides 105 and 205 in other embodiments. Footprints 1905 and 1910 need not be identical, and the circuitry included in active or IP circuitry need not be identical.

FIG. 3 shows a top down view of an example semiconductor device 300 after die 100 and die 200 have been attached to a first major surface 310 of lid or temporary carrier 305. Die 100 and die 200 are arranged on lid or temporary carrier 305 so that the die to die communication edges 230 and 235 of die 100 and die 200 are adjacent and in close proximity to one another. It is preferred that wire bonding pads 115(1)-(K) and 215(1)-(M) on edges 230 and 235 are aligned to one another to minimize the distance between the wire bonding pads and shorten the length of wire that will be used to form wire bonds between the two sets of wire bonding pads, as further discussed below in connection with FIGS. 5 and 6.

In some embodiments, die 100 and die 200 are permanently attached to a package lid 305, while die 100 and die 200 may be temporarily attached to a temporary carrier 305 in other embodiments. Die 100 and die 200 may be attached permanently or temporarily to lid or temporary carrier 305 with die attach material, which is a material having sufficient adhesive strength to attach die 100 and 200 to lid or temporary carrier 305 while withstanding ultrasonic or thermosonic forces present during wire bonding, as further discussed below in connection with FIGS. 5 and 6. Examples of lid or temporary carrier 305 include but are not limited to a carrier made of a conductive material, such as copper, aluminum, alloys of such materials, or other materials such as plastic, glass, and the like. Examples of die attach material include, but are not limited to, polymer adhesives, epoxies, solders, pastes, films, tailored die cut tapes, and the like. For permanent attachment to a package lid 305 in some embodiments, thermal interface material (TIM) may be used as the die attach material, which is heat conductive, allowing package lid 305 to act as a heat sink for die 100 and die 200 in the resulting semiconductor package. Examples of TIM include, but are not limited to, silicone or epoxy-resin based material containing suspended carbon nanotubes, or beryllium oxide, aluminum nitride, boron nitride, or diamond powders. In some embodiments, TIM can be a phase-change metal alloy, a grapheme-based adhesive, and the like. Lid or temporary carrier 305 may be formed of aluminum, aluminum alloys, copper, copper alloys, boron nitride, aluminum nitride, diamond, carbon nanotubes, and combinations thereof.

Figure 4:
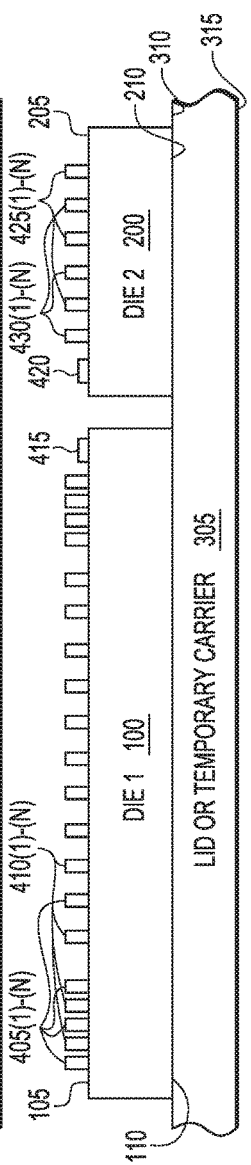

FIG. 4 shows a cross-sectional view of semiconductor device 300 at line 4, which has active sides 105 and 205 oriented in an upward direction (e.g., face up). Back sides 110 and 210 are attached to the first major surface 310 of lid or temporary carrier 305 by die attach material, which is not shown for simplicity's sake. Lid or temporary carrier 305 also has a second major surface 315 opposite the first major surface 310. It is noted that the cross-sectional view of semiconductor device 300 includes a first set of bumped bonding pads 405(1)-(N) in a row across die 100 that are directly intersected by line 4 in FIG. 3. The cross-sectional view of semiconductor device 300 also shows a second set of bumped bonding pads 410(1)-(N) that are in the next row parallel to line 4 in the direction of the cross-sectional view, which is indicated in FIG. 3 as the row that includes bumped bonding pad 410(1). In the embodiment shown, rows of bumped bonding pads on active side 105 alternate in a staggered arrangement, which can be seen as pad 410(1) is staggered from or off-set from pad 405(1). In this manner, bonding pads 405(1)-(N) and 410(1)-(N) are shown as alternating across active side 105 in FIG. 4.

Similarly, the cross-sectional view of semiconductor device 300 also includes a first set of bumped bonding pads 430(1)-(N) in a row across die 200 that are directly intersected by line 4 in FIG. 3, which alternate with a second set of bumped bonding pads 425(1)-(N) that are in the next row parallel to line 4 in the direction of the cross-sectional view, shown as the row that includes bumped bonding pad 430(N). In the embodiment shown, rows of bumped bonding pads on active side 205 alternate in a staggered arrangement, which can be seen as pad 430(N) is staggered from or off-set from pad 425(N).

Line 4 also intersects wire bonding pad 415 on communication edge 230 and wire bonding pad 420 on communication edge 235. It is noted that the wire bonding pads are not necessarily aligned with each row of bumped bonding pads on the respective die, and in some embodiments may be off-set such shown by wire bonding pad 435 not being aligned with any row of bumped bonding pads on die 100 and by wire bonding pad 440 not being aligned with any row of bumped bonding pads on die 200 (e.g., shown as being aligned "in between" neighboring rows of bumped bonding pads).

Figure 5:
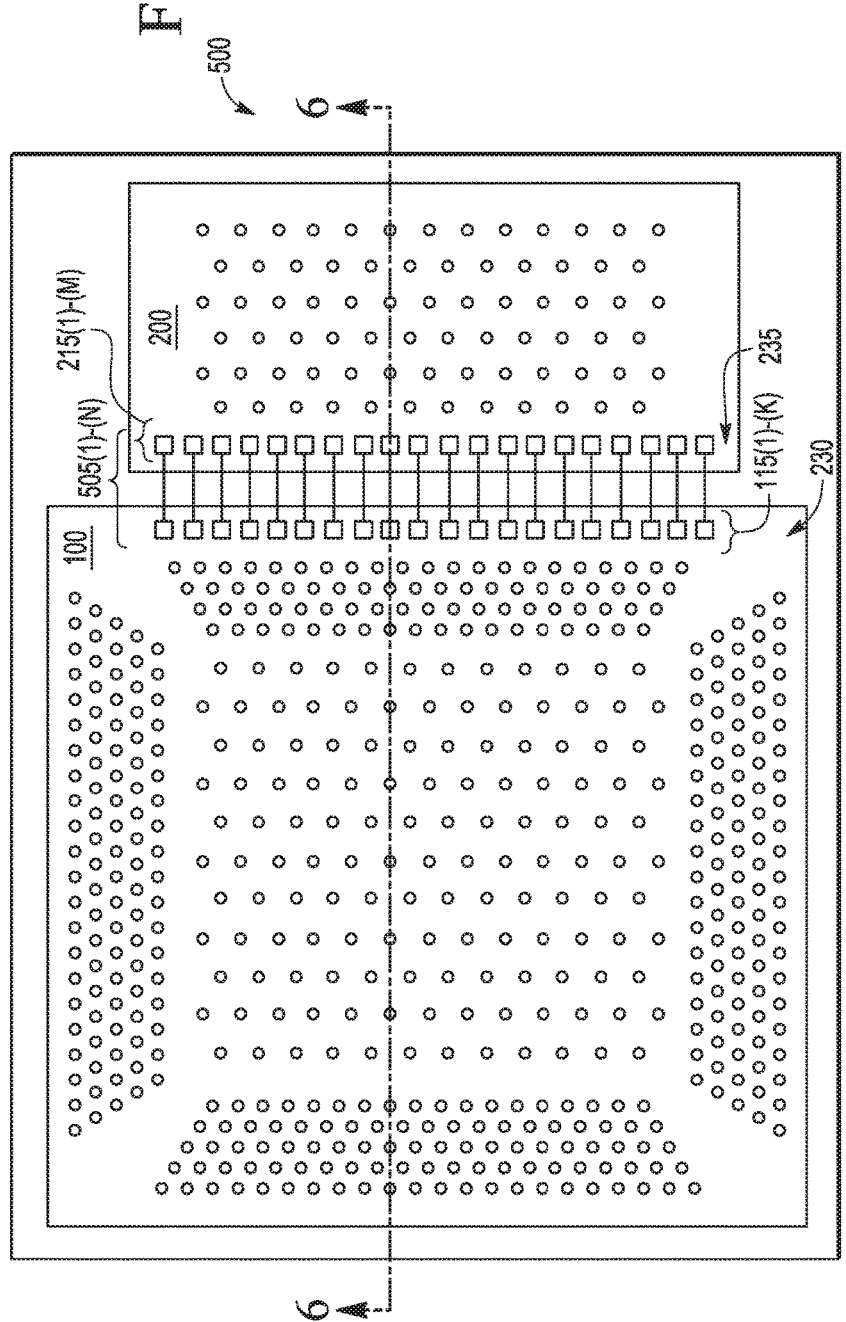
FIGS. 5 and 6 illustrate block diagrams depicting an example semiconductor device having a wiring pattern after wire bonding, according to some embodiments of the present disclosure.
Figure 6:
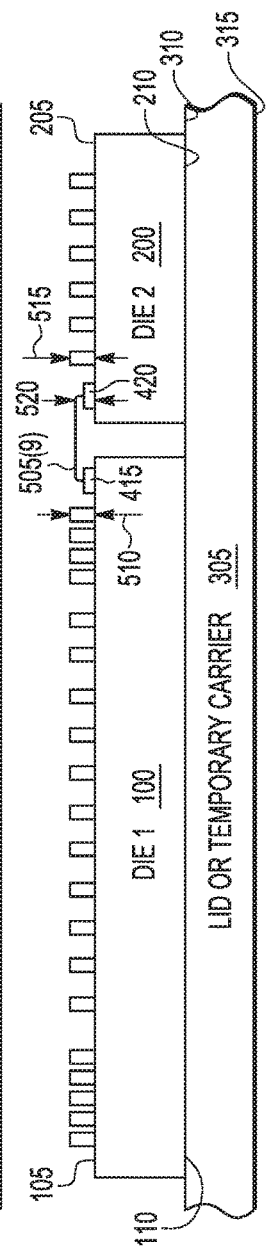

FIG. 5 shows a top down view of example semiconductor device 500 after wire bonding is performed to create wire bond interconnects between the die to die communication edges 230 and 235 of die 100 and 200. FIG. 6 shows a cross-sectional view of semiconductor device 500 at line 6, with active sides 105 and 205 still oriented in an upward direction (e.g., face up). In the embodiment shown, each die 100 and 200 include wire bonding pads 115(1)-(K) and 215(1)-(M) arranged in a single row parallel to the respective die to die communication edges 230 and 235. A plurality of wire bonds 505(1)-(N) are formed between a respective one of the wire bonding pads 115(1)-(K) on edge 230 and a respective one of the wire bonding pads 215(1)-(M) on edge 235 to form a plurality of electrical connections between die 100 and die 200 for die to die communication, also referred to as wire bond interconnects 505(1)-(N). The wire bond interconnects 505(1)-(N) may convey various signals or supply voltages, such as power and ground voltages.

An example wire bond interconnect 505(9) is shown in the cross-sectional view between example wire bonding pads 415 and 420, which are aligned with another (as indicated by both pads being intersected by line 6) and are also referred to as being adjacent to one another. A wire bonding tool is used to bond or connect a wire to pads 415 and 420 using ultrasonic or thermosonic energy to form a low-loop-height wire bond, such as wire bond 505(9). The wire may be bonded or connected to pads 415 and 420 by one or more of ball bonds, wedge bonds, stitch bonds, and the like formed by the wire bonding tool. Wire bond interconnect 505(9) forms an electrical connection between pads 415 and 420 to enable communication between die 100 and die 200. The wire itself is formed from a conductive metal, examples of which include but are not limited to copper, silver, gold, aluminum, alloys of such metals, or other suitable conductive material or combination of materials. The wire bonding tool may also implement fine pitch wire bonds, such as a pitch or width between neighboring wire bonding pads of 40 microns. For comparison, a pitch or width between neighboring bumped bonding pads may be 105 microns. Fine pitch wire bonding can thus achieve denser die to die wire bond interconnects in a square unit than would be achieved by trying to implement additional bumped bonding pads.

Each of the bumped bonding pads on die 100 has a total height 510 measured from the active side 105 of die 100 to the top of the flip chip bump, which includes both the height of the individual flip chip bump and the height of the bonding pad on which the flip chip bump is formed. Similarly, each of the bumped bonding pads on die 200 has a total height 515 measured from the active side 205 of die 200 to the top of the flip chip bump, which includes both the height of the individual flip chip bump and the height of the bonding pad on which the flip chip bump is formed. In order to maintain planarity of the top surfaces of the flip chip bumps on die 100 and die 200, total height 510 and 515 are the substantially the same value.

Each of the wire bond interconnects 505(1)-(N) has a total height 520 measured from the active side 105 to the apex of the wire bond (or to the top of the wire bond's arch), which is also equivalent to the total height when measured from the active side 205 to the apex of the wire bond. The total height 520 includes the height of the wire bond itself and the height of the bonding pad on which the wire bond is formed. The total height 520 is less than the total height 510 and 515 of the bumped bonding pads on die 100 and die 200. Stated another way, since the bonding pads and wire bonding pads have a same uniform height, the height of each wire bond measured from the top of the wire bonding pad to the top of the wire bond's arch is less than the height of a flip chip bump measured from the top of the bonding pad to the top of the flip chip bump. For example, a low-loop-height wire bond may have a total height 520 of 45 or 50 microns, where the flip chip bumps may have a total height 510 and 515 of 65 to 80 microns.

FIG. 7 shows a cross-sectional view of an example semiconductor device 700 after flipping lid or temporary carrier 305 to which die 100 and die 200 are attached (such as taking the device illustrated in FIG. 6 and turning it upside down) and mounting die 100 and die 200 on a first major surface of substrate 705. As shown in FIG. 7, active sides 105 and 205 are oriented in a downward direction (e.g., face down), with the first major surface 310 of lid or temporary carrier 305 also oriented downward. The bumped bonding pads of die 100 and die 200 are aligned to and joined to a set of die contact pads on the first major surface 710 of substrate 705, which is oriented in an upward direction. In other words, each flip chip bump joined to a respective bumped bonding pad of die 100 and 200 is also joined to a respective contact pad on the first major surface 710. It is noted that the height of each wire bond is less than the height of each flip chip bump in order to ensure that the wire bond interconnects 505(1)-(N) do not contact the first major surface 710 when die 100 and die 200 are mounted to substrate 705.

Substrate 705 also has a second major surface 715 that is opposite the first major surface 710, where the second major surface 715 includes another set of contact pads for external contact. The contact pads on the first and second major surfaces 710 and 715 of substrate 705 may be metallized or have a wettable coating. The contact pads of substrate 705 may be formed from any of the conductive materials discussed above in connection with the bonding pads of die 100 and die 200.

Substrate 705 includes substrate layers of dielectric and conductive materials to form conductive structures, such as plating, pads, internal electrical interconnects, and vias. Examples of substrate 705 include, but are not limited to, a ball grid array (BGA), a pin grid array, an in-line package, a flat package, a chip carrier, a printed circuit board (PCB), and the like.

The conductive structures of substrate 705 can be used for routing various electrical connections from the die contact pads on the first major surface 710 to external contact pads on the second major surface 715. The flip chip bumps of the bumped bonding pads of die 100 and 200 are reflowed or re-melted to form electrical connections to the die contact pads on the first major surface 710 of substrate 705. Solder balls are applied to the external contact pads on the second major surface 715 of substrate 705, which is further discussed below in connection with FIG. 10.

In some embodiments, substrate 705 also includes conductive structures to route a set of electrical connections between die 100 and die 200, also referred to as flip chip interconnects, which are further discussed below in connection with FIG. 16A-16H.

FIG. 8 shows a cross-sectional view of an example semiconductor device 800 after an encapsulation process that implements a partial encapsulation or underfill process, which may be performed on the device illustrated in FIG. 7. In the embodiment shown in FIG. 7, a space (e.g., void or absence of material) is formed under die 100 and die 200 when the die are mounted to substrate 705. FIG. 8 shows an encapsulant material 805 is flowed under and around die 100 and die 200, in between the flip chip bumps and over and around the wire bonds, to fill in the space. Ideally, encapsulant material 805 makes contact with both active sides 105 and 205 and the first major surface 710 of substrate 705, leaving no voids, in order to protect the flip chip bumps and the wire bonds from thermomechanical stresses. As a result of the underfill process, the encapsulant material 805 need not make contact with the first major surface 310 of lid or temporary carrier 305, and instead partially covers the side walls 810 and 815 of die 100 and 200.

It is noted that the underfill process illustrated in FIG. 8 may be preferable in embodiments where die 100 and die 200 are temporarily attached to temporary carrier 305. In such embodiments, subsequent packaging of die 100 and die 200 may performed after the temporary carrier 305 is removed, such as further encapsulating die 100 and die 200 (e.g., to cover and protect the back sides of die 100 and 200 with encapsulant material).

Examples of encapsulant material 805 include but are not limited to polymer materials such as epoxies, which may be heat or light curable or may not require a curing step, or other materials having a viscosity suitable for underfill dispensing techniques, such as dam and fill dispensing technique or glob top dispensing technique.

FIG. 9 shows a cross-sectional view of an example semiconductor device 900 after an encapsulation process that implements a full encapsulation process, which may be performed on the device illustrated in FIG. 7. As noted above, a space is formed under die 100 and die 200 when the die are mounted to substrate 705. FIG. 9 shows an encapsulant material 905 is dispensed under and around die 100 and 200, in between the flip chip bumps and over and around the wire bonds, to fill in the space. Ideally, encapsulant material 905 makes contact with both active sides 105 and 205, the first major surface 710 of substrate 705, and the first major surface 310 of lid or temporary carrier 305, without leaving any voids. As a result of the encapsulation process, encapsulant material 905 completely covers the side walls 810 and 815 of die 100 and 200.

It is noted that the encapsulation process illustrated in FIG. 9 may be preferable in embodiments where die 100 and die 200 are permanently attached to lid 305. It is also noted that in some embodiments, the encapsulation process shown in FIG. 9 may start with the underfilled device shown in FIG. 8, where additional encapsulation material is dispensed to ensure that some form of encapsulant material is present between the first major surface 710 of substrate 705 and the first major surface 310 of lid or temporary carrier 305 without any voids, in order to protect the flip chip bumps and the wire bonds from thermomechanical stresses. In some embodiments where die 100 and 200 are temporarily attached to temporary carrier 305, the temporary carrier 305 of the fully encapsulated device shown in FIG. 9 may then be removed and additional encapsulant material 905 may be dispensed to further cover the back sides 110 and 210 of die 100 and 200, where the resulting semiconductor device has encapsulant material 905 surrounding both die 100 and 200.

Examples of encapsulant material 905 include but are not limited to a mold compound including polymer materials based on a biphenyl type or multi-aromatic type epoxy resin, which may be heat or light curable or may not require a curing step, may include filler material, or other types of encapsulating materials that are suitable for encapsulation techniques, such as injection molding technique, transfer molding technique, or compression molding technique.

FIG. 10 shows a cross-sectional view of an example semiconductor device 1000 after solder ball attachment, which is performed on the fully encapsulated device shown in FIG. 9. In other embodiments, solder ball attachment may be performed on the underfilled device shown in FIG. 8.

Solder balls 1005(1)-(N) are applied to the external contact pads on the second major surface 715 of substrate 705. While the embodiment shown in FIG. 10 has the second major surface 715 oriented in a downward direction, solder ball attachment may include flipping the device shown in FIG. 9 to have the second major surface 715 oriented in an upward direction. Solder balls 1005(1)-(N) may be deposited or placed on each external contact pad on the second major surface 715, and reflowed or re-melted to form electrical connections to the external contact pads on the second major surface 710.

Figure 11:
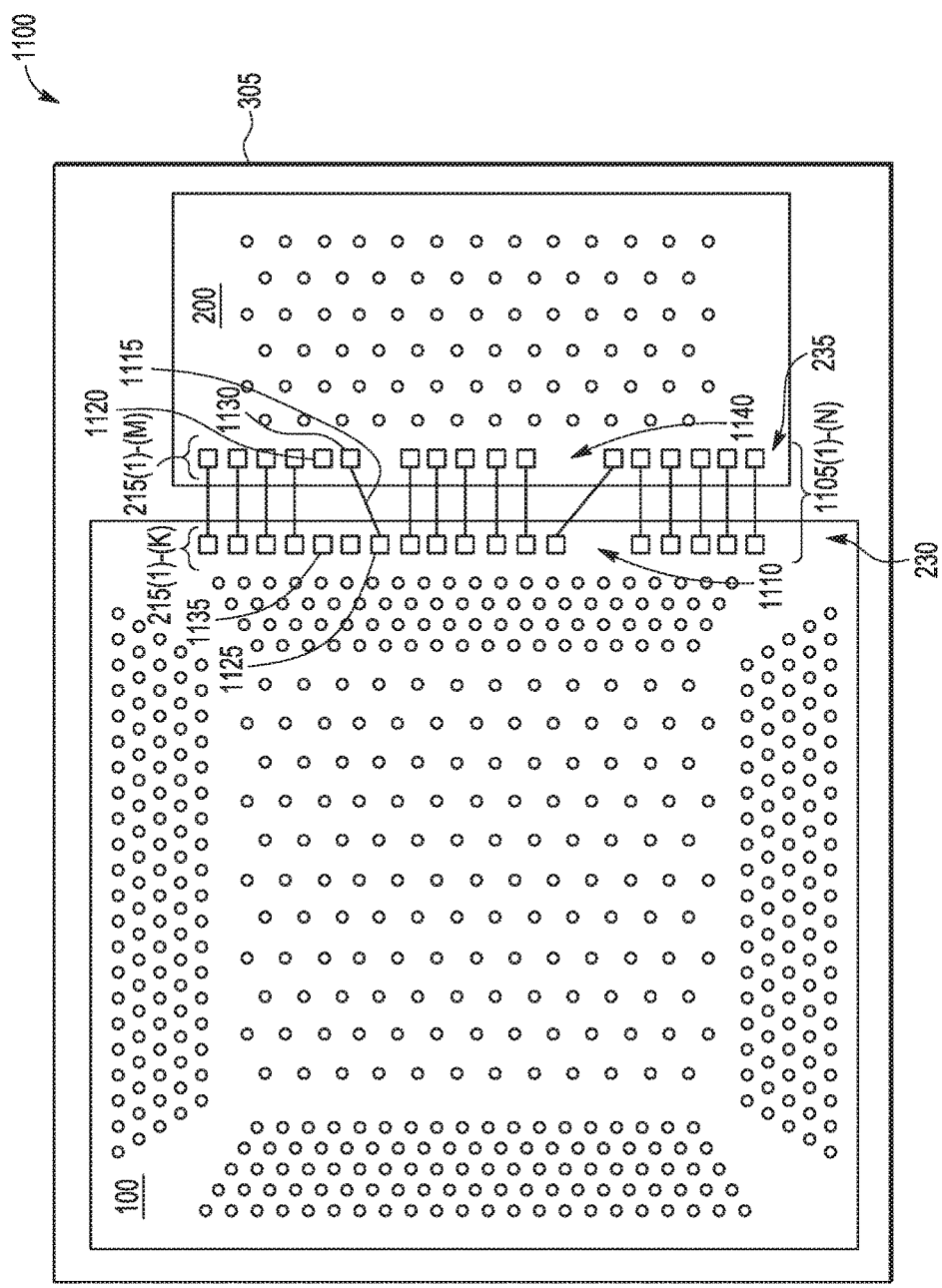
FIG. 11 illustrates a block diagram depicting an example semiconductor device having another wiring pattern after wire bonding, according to some embodiments of the present disclosure.

FIG. 11 shows a top down view of an example semiconductor device 1100 having another wiring pattern after wire bonding is performed to create wire bond interconnects between the die to die communication edges 230 and 235 of die 100 and 200. In the embodiment shown, a plurality of wire bond interconnects 1105(1)-(N) are formed between a respective one of the wire bonding pads 115(1)-(K) and a respective one of the wire bonding pads 215(1)-(M), using a wire bonding process as similarly discussed above in connection with FIGS. 5 and 6.

It is noted that the wire bond interconnects 1105(1)-(N) need not be formed between each adjacent (e.g., aligned across edges 230 and 235) wire bonding pad. Additionally, not every wire bonding pad needs to be bonded to a wire. Rather, wire bond interconnects 1105(1)-(N) are formed as needed between various wire bonding pads on the pair of edges 230 and 235, to achieve the electrical connections required by the active or IP circuitry on die 100 and 200. For example, wire bond interconnect 1115 is formed between non-adjacent wire bonding pads 1125 and 1130. Also, wire bonding pads 1135 and 1120 are not bonded to any wire.

It is also noted that the wire bonding pads on each communication edge may be arranged in rows or other arrangements, which do not need to be fully populated. In the embodiment shown, de-populated areas 1110 and 1140 are included in the wire bonding pads 115(1)-(K) and 215(1)-(M) arrangements on edges 230 and 235, which also need not be aligned or adjacent to one another. As also noted above, the sets of wire bonding pads 115(1)-(K) and 215(1)-(M) need not have the same number of pads.

Figure 12:
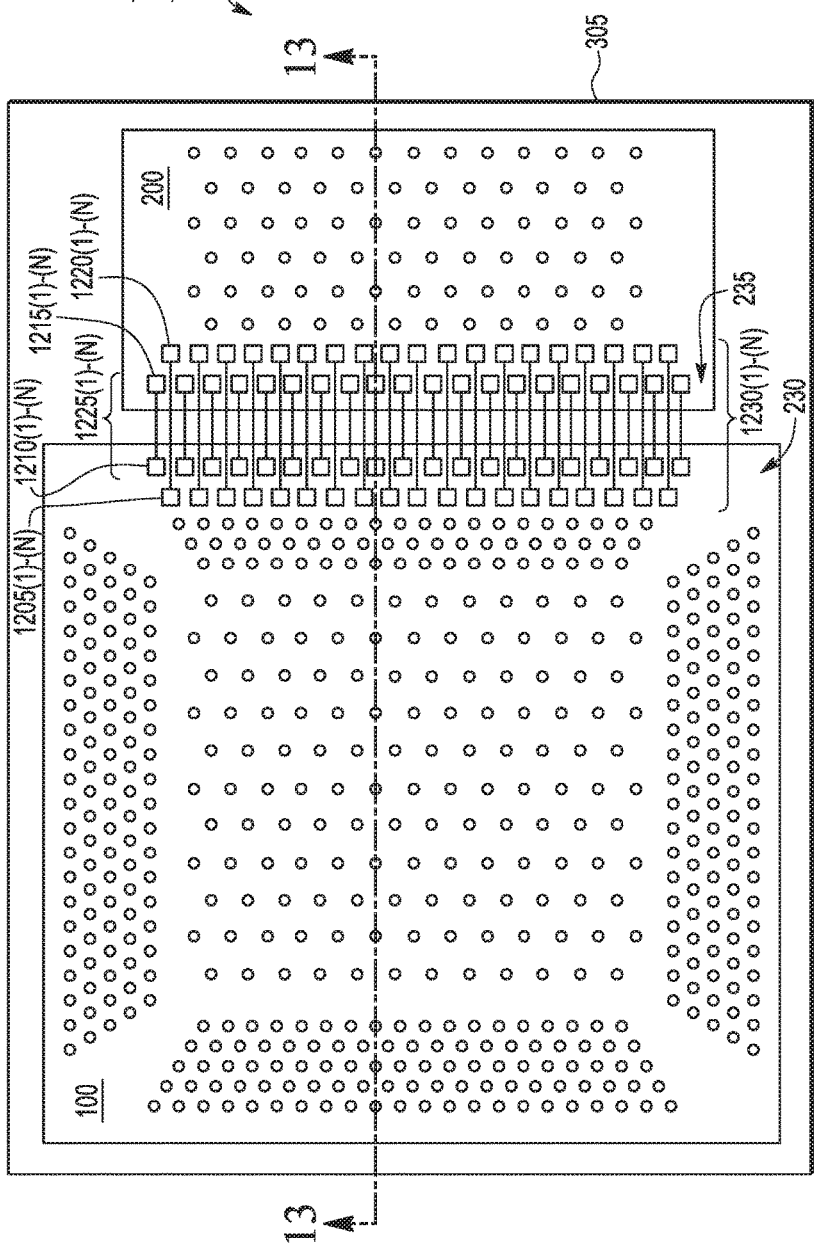
FIGS. 12 and 13 illustrate block diagrams depicting an example semiconductor device having another wiring pattern after wire bonding, according to some embodiments of the present disclosure.
Figure 13:
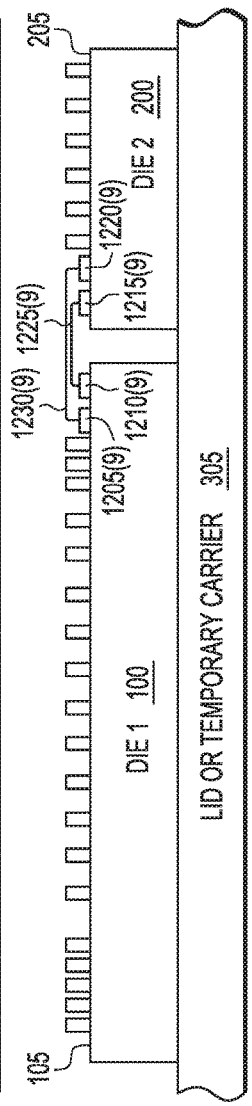

FIG. 12 shows a top down view of an example semiconductor device 1200 having another wiring pattern after wire bonding is performed to create wire bond interconnects between the die to die communication edges 230 and 235 of die 100 and 200. FIG. 13 shows a cross-sectional view of semiconductor device 1200 at line 13 with active sides 105 and 205 oriented in an upward direction.

In the embodiment shown, two sets of wire bonding pads 1205(1)-(N) and 1210(1)-(N) are arranged in rows parallel to the communication edge 230 of die 100, and two sets of wire bonding pads 1215(1)-(N) and 1220(1)-(N) are arranged in rows parallel to the communication edge 235 of die 200. A first set of wire bond interconnects 1225(1)-(N) are formed between a respective one of wire bonding pads 1210(1)-(N) and a respective one of wire bonding pads 1215(1)-(N), and a second set of wire bond interconnects 1230(1)-(N) are formed between a respective one of wire bonding pads 1205(1)-(N) and a respective one of wire bonding pads 1220(1)-(N), using a wire bonding process as similarly discussed above in connection with FIGS. 5 and 6.

In the embodiment shown, the two sets of wire bonding pads 1205(1)-(N) and 1210(1)-(N) on edge 230 are staggered or off-set from one another, and the two sets of wire bonding pads 1215(1)-(N) and 1220(1)-(N) on edge 235 are staggered or off-set from one another. Wire bonding pads 1205(1)-(N) and 1210(1)-(N) are respectively aligned with wire bonding pads 1220(1)-(N) and 1215(1)-(N) to form pairs of adjacent pads on edges 230 and 235. This alignment allows wire bond interconnects 1225(1)-(N) and 1230(1)-(N) to be formed between the pairs of adjacent pads without the wire bonds contacting one another. In this manner, wire bond interconnects 1225(1)-(N) are shown as alternating with wire bond interconnects 1230(1)-(N) across edges 230 and 235, illustrated as shorter lines depicting interconnects 1225 alternating with longer lines depicting interconnects 1230.

While wire bond interconnects 1225(1)-(N) and 1230(1)-(N) are formed between wire bonding pads that are adjacent to one another (e.g., aligned across edges 230 and 235) in the embodiment shown, such wire bond interconnects need not be formed between each adjacent wire bonding pad in other embodiments. The wire bond interconnects 1225(1)-(N) and 1230(1)-(N) are formed as needed between various wire bonding pads on the pair of edges 230 and 235 to achieve the electrical connections required by the active or IP circuitry on die 100 and 200, and may exhibit the characteristics discussed above in connection with FIG. 11, such as wire bonds formed between non-adjacent pads, some pads lacking any wire bond, de-populated areas, and non-equal numbers of pads on edges 230 and 235.

Example wire bond interconnect 1225(9) is shown in the cross-sectional view between example wire bonding pads 1210(9) and 1215(9), which is intersected by line 13. Example wire bond interconnect 1230(9) that is parallel to line 13 is also shown in the cross-sectional view between wire bonding pads 1205(9) and 1220(9) that are next to pads 1210(9) and 1215(9) in the direction of the cross-sectional view. While wire bond interconnect 1230(9) is shown as having a greater height than wire bond interconnect 1225(9) (e.g., in order to show both wire bond interconnects in the cross-sectional view without touching one another), wire bond interconnects 1230(9) and 1225(9) may have substantially the same height in some embodiments. Further, since wire bond interconnects are formed as needed between various wire bonding pads on edges 230 and 235, some wire bond interconnects may cross over other wire bond interconnects. It is noted that such crossing wire bond interconnects would have different heights to ensure that the wire bond interconnects do not touch one another (e.g., one interconnect would have a greater height than the other, as measured from the top of the active side to the apex of the wire bond), as further discussed below in connection with FIG. 17.

Figure 14:
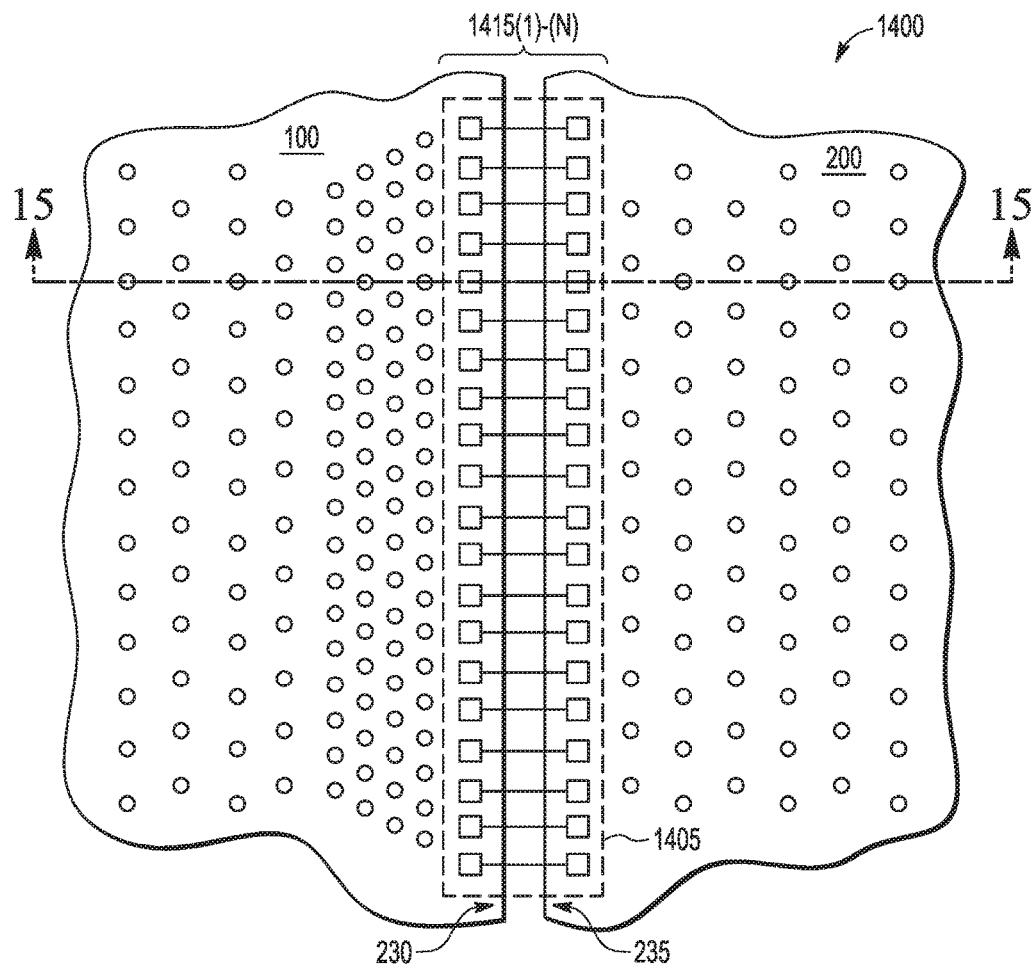
FIGS. 14 and 15 illustrate block diagrams depicting an example semiconductor device having a ground plane in the substrate under the wiring pattern, according to some embodiments of the present disclosure.
Figure 15:
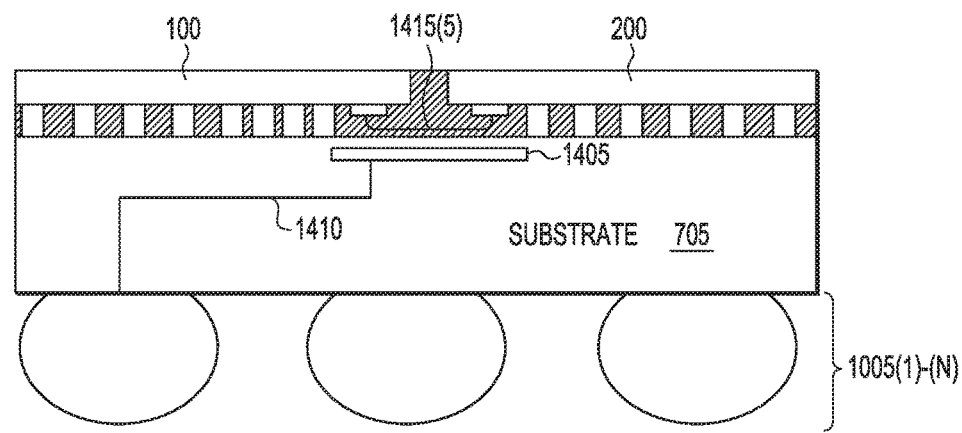

FIG. 14 shows a top down view of an example semiconductor device 1400 having a ground plane 1405 in the substrate 705 under the wiring pattern formed between edges 230 and 235. FIG. 15 shows a cross-sectional view of semiconductor device 1400 at line 15, which intersects example wire bond interconnect 1415(5). Ground plane 1405 is formed as one or more substrate layers within or on top of substrate 705 and is positioned in a location of substrate 705 that will later be in close proximity to (e.g., positioned under) the wire bond interconnects formed across edges 230 and 235 once die 100 and 200 are mounted to substrate 705. In the embodiment shown, ground plane 1405 is connected by an electrical interconnect 1410 to one of the solder balls 1005(1)-(N) on the substrate 705, which may serve as a ground voltage supply terminal. In this manner, ground plane 1405 provides added shielding between the wire bond interconnects and electrical interconnects within substrate 705, in order to reduce the effects of self-inductance and coupling inductance. It is noted that a lower portion of semiconductor device 1400 is shown in the cross-sectional view, where semiconductor device 1400 may be an underfilled device like that shown in FIG. 8 or a fully encapsulated device like that shown in FIG. 9. Further, in some embodiments, semiconductor device 1400 may include lid or temporary carrier 305, and may not include lid or temporary carrier 305 in other embodiments. In other embodiments, die 100 and 200 may further be surrounded (i.e., back sides 110 and 210 are covered) with encapsulant material.

FIG. 16A-16H each show cross-sectional views of example semiconductor devices having different interconnect combinations for die to die communication, including one or more wire bond interconnects between die, one or more flip chip interconnects between die in the substrate, and both. The example semiconductor devices include die 100, die 200, and substrate 705. It is noted that lower portions of each example semiconductor device where die 100 and 200 are connected to substrate 705 are shown in the cross-sectional views, where each example semiconductor device may be an underfilled device like that shown in FIG. 8 or a fully encapsulated device like that shown in FIG. 9. Further, in some embodiments, each example semiconductor device may include lid or temporary carrier 305, and may not include lid or temporary carrier 305 in other embodiments. In other embodiments, die 100 and 200 may further be surrounded (i.e., back sides 110 and 210 are covered) with encapsulant material. In addition to the embodiments discussed herein, each interconnect combination shown in FIG. 16A-16H may also be implemented in the semiconductor devices discussed above. FIG. 16A-16D illustrate example combinations that include at least one wire bond interconnect 1640 between communication edges 230 and 235 of adjacent die, while FIG. 16E-16H illustrate example combinations that include two or more wire bond interconnects 1640 and 1645 between communication edges 230 and 235 of adjacent die, as further discussed below.

Figure 16A:
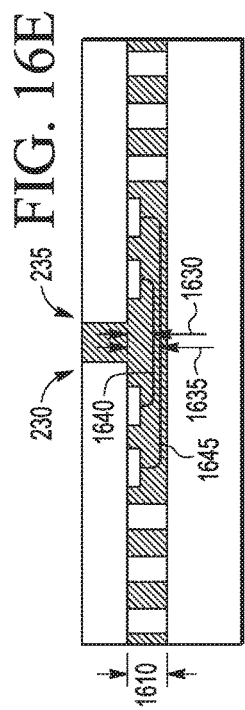
FIG. 16A-16H illustrate block diagrams depicting example semiconductor devices having different interconnect combinations including wire bond interconnect(s) between die, flip chip interconnect(s) in the substrate, and both, according to some embodiments of the present disclosure.

FIG. 16A shows an example semiconductor device including at least one wire bond interconnect 1640 between communication edges 230 and 235. It is noted that the total height 1605 of the wire bond interconnect 1640 is less than the total height 1610 of the flip chip bumped bonding pad 1650 (which is substantially the same height for all flip chip bumped bonding pads in the illustrated semiconductor device), in order to prevent wire bond interconnect 1640 from making contact with the first major surface of substrate 705. The discussion regarding wire bond interconnects provided above is applicable to the at least one wire bond interconnect 1640 discussed in connection with FIG. 16A-16H.

Figure 16B:
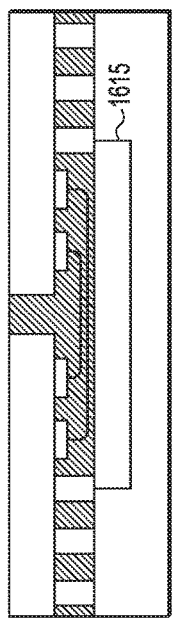

FIG. 16B shows an example semiconductor device including at least one wire bond interconnect 1640 and at least one flip chip interconnect 1615. Flip chip interconnect 1615 is an electrical connection formed in substrate layers in substrate 705 between contact pads on the first major surface of substrate 705 to which flip chip bumped bonding pads 1650 and 1655 are connected. Flip chip bumped bonding pad 1655 is located on or near communication edge 230 and flip chip bumped bonding pad 1650 is located on or near communication edge 235. Flip chip interconnect 1615 may be formed in substrate 705 at a depth 1670 measured from the first major surface of substrate 705 to the farthest point of flip chip interconnect 1615 from the first major surface. Flip chip interconnect 1615 provides die to die communication between communication edges 230 and 235 of neighboring or adjacent die.

While at least one flip chip interconnect 1615 is illustrated, it is noted that a plurality of flip chip interconnects 1615 may be provided between flip chip bumped bonding pads on communication edges 230 and 235, which are formed to achieve the electrical connections required by the active or IP circuitry on die 100 and 200. For example, flip chip interconnect 1615 may be formed between adjacent bumped bonding pads 1650 and 1655 (e.g., are aligned with one another in the plane of the cross-sectional view of FIG. 16B) or may be formed between non-adjacent bumped bonding pads 1650 and 1655 (e.g., interconnect 1615 is formed between pads 1650 and 1655 that are not aligned in the plane of FIG. 16B, in a manner similar to interconnect 1115 that is formed between non-adjacent pads 1125 and 1130 in FIG. 11). Also, a plurality of flip chip interconnects may be formed between a set of bumped bonding pads that are closest to communication edges 230 and 235, such as bumped bonding pads 1650 and 1655, in order to minimize the distance between the interconnected bumped bonding pads. Additionally, de-populated areas may be present in the arrangement of bumped bonding pads. It is also noted that the discussion regarding the flip chip interconnect 1615 is also applicable to the other flip chip interconnects, including flip chip interconnect 1620, discussed in connection with FIG. 16B-16H.

Figure 16C:
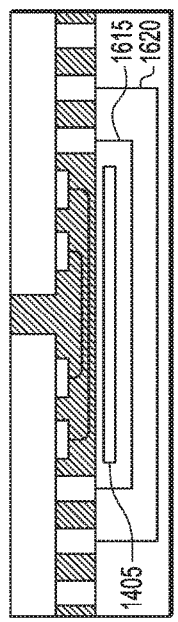

FIG. 16C shows an example semiconductor device including at least one wire bond interconnect 1640, at least one flip chip interconnect 1615, and a ground plane 1405. The discussion regarding ground plane 1405 illustrated in FIG. 14 is also applicable to the ground plane 1405 illustrated in FIG. 16C and in FIG. 16G. Although not shown in the example cross-sectional view of FIG. 16C, ground plane 1405 includes an internal electrical interconnect that connects ground plane 1405 to a ground voltage supply terminal, such as to an external connection on substrate 705. Ground plane 1405 is shown at a position in substrate 705 between the at least one wire bond interconnect 1640 and the at least one flip chip interconnect 1615, in order to provide improved shielding between wire bond interconnects and flip chip interconnects, as well as other internal interconnects of substrate 705.

Figure 16D:
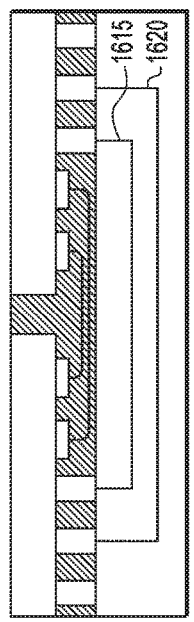

FIG. 16D shows an example semiconductor device including at least one wire bond interconnect 1640 and two or more flip chip interconnects 1615 and 1620. Flip chip interconnect 1620 is another electrical connection formed in substrate layers of substrate 705 between contacts pads on the first major surface of substrate 705 to which flip chip bumped bonding pads 1660 and 1665 are connected. Flip chip interconnect 1620 also provides die to die communication between neighboring or adjacent die. It is noted that flip chip interconnect 1620 is shown as being underneath flip chip interconnect 1615 (e.g., in order to show both interconnects 1615 and 1620 without touching one another), but flip chip interconnect 1620 may be adjacent to flip chip interconnect 1615 in other embodiments (e.g., interconnect 1620 is connected to flip chip bumped bonding pads 1660 and 1665 that are staggered or off-set from pads 1650 and 1655 in the direction of the cross-sectional view of FIG. 16D, in a manner similar to that discussed above in connection with alternating adjacent wire bond interconnects 1230(1)-(N) and 1225(1)-(N) in FIGS. 12 and 13). In this manner, flip chip interconnect 1620 is shown to have a greater depth 1675 than the depth 1670 of flip chip interconnect 1615, but depths 1675 and 1670 may be substantially the same in other embodiments.

Figure 16E:
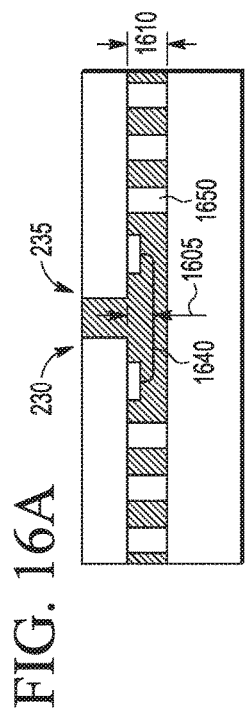

FIG. 16E shows an example semiconductor device including two or more wire bond interconnects 1640 and 1645 between communication edges 230 and 235. It is noted that the total height 1630 and 1635 of the wire bond interconnects 1640 and 1645 are both less than the total height 1610 of the flip chip bumped bonding pads (which is substantially the same height for all flip chip bumped bonding pads in the illustrated semiconductor device). It is also noted that while the total height 1635 is shown as being greater than total height 1630, heights 1630 and 1635 may be substantially the same in other embodiments (e.g., wire bond interconnects 1640 and 1645 may be adjacent and alternating in a manner similar to that discussed above in connection with alternating adjacent wire bond interconnects in FIGS. 12 and 13).

Figure 16F:
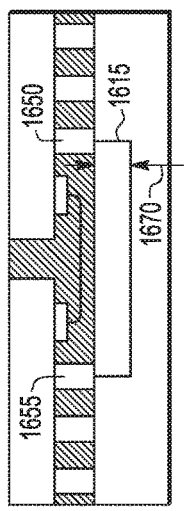
Figure 16G:
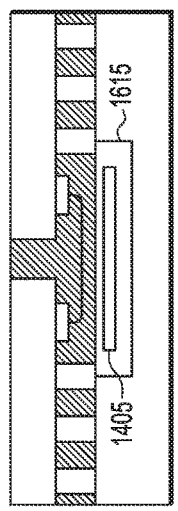
Figure 16H:
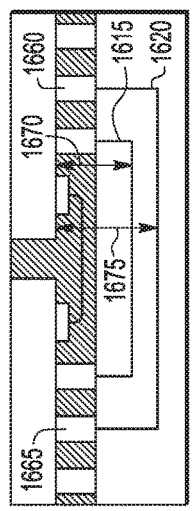

FIG. 16F shows an example semiconductor device including two or more wire bond interconnects 1640 and 1645 and at least one flip chip interconnect 1615. FIG. 16G shows an example semiconductor device including two or more wire bond interconnects 1640 and 1645, two or more flip chip interconnects 1615 and 1620, and ground plane 1405. FIG. 16H shows an example semiconductor device including two or more wire bond interconnects 1640 and 1645 and two or more flip chip interconnects 1615 and 1620. The discussion regarding the various components illustrated in FIG. 16A-16E is also applicable to the components illustrated in FIG. 16F-16H.

Figure 17:
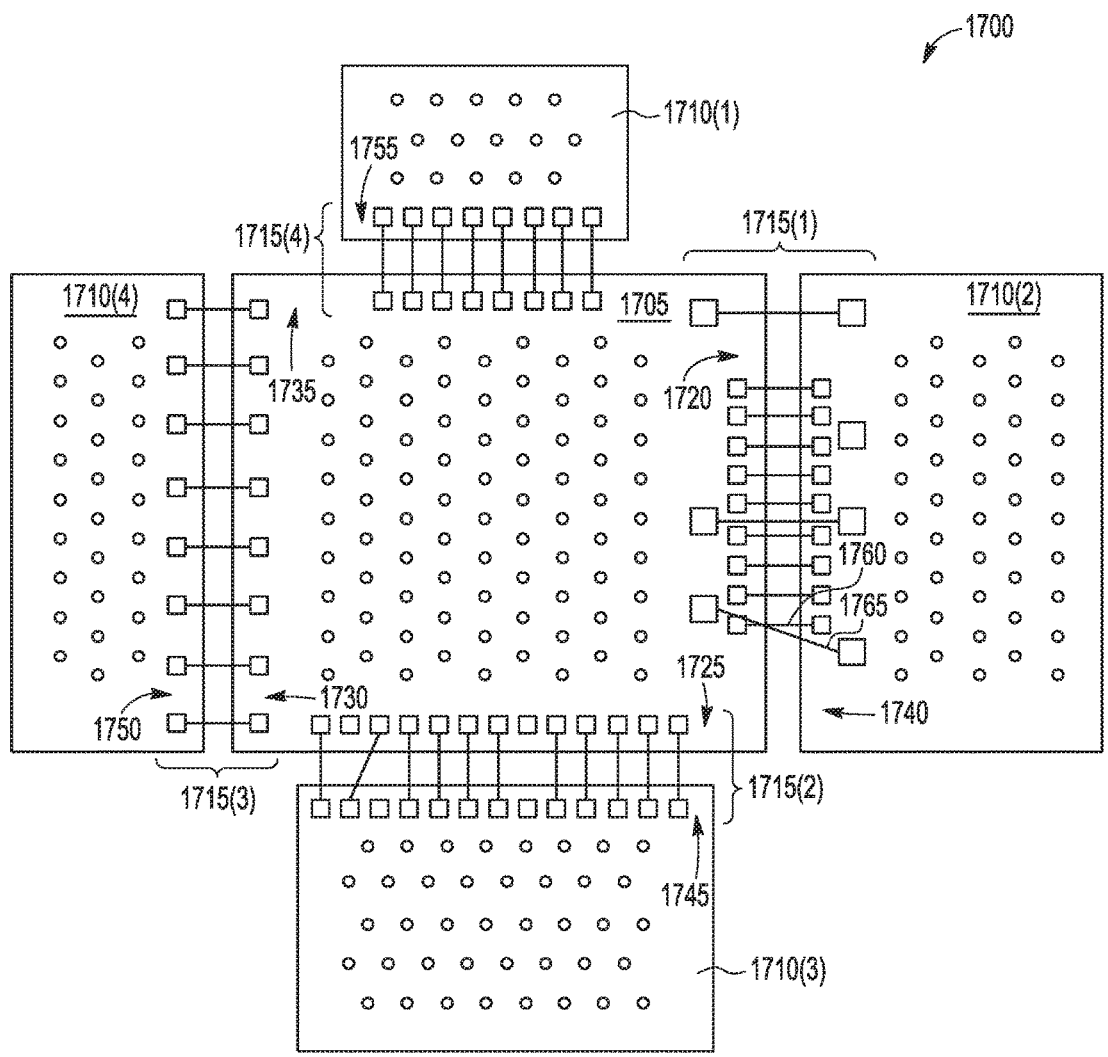
FIG. 17 illustrates a block diagram depicting multiple interconnected die, according to some embodiments of the present disclosure.

FIG. 17 shows a top down view of a semiconductor device 1700 that includes multiple interconnected die. The die may be permanently or temporarily attached to a lid or temporary carrier 305 like that discussed above. Each die included in a semiconductor device according to the present disclosure may have any number of die to die communication edges. In the embodiment shown, die 1705 includes four communication edges 1720, 1725, 1730, and 1735, although die 1705 may include additional or fewer communication edges in other embodiments. Die 1710(1)-(4) each include a single communication edge, which are 1740, 1745, 1750, and 1755, respectively, although each die 1710(1)-(4) may include additional communication edges in other embodiments.

Wire bond interconnects are formed between a given pair of adjacent communication edges that are in close proximity to each other. In the embodiment shown, wire bond interconnects 1715(1) are formed between edges 1720 and 1740, interconnects 1715(2) are formed between edges 1725 and 1745, interconnects 1715(3) are formed between edges 1730 and 1750, and interconnects 1715(4) are formed between edges 1735 and 1755. Any number of flip chip interconnects, a ground plane, or both may also be implemented between each pair of communication edges, as discussed above in connection with FIG. 16A-16H. Since the various wire bond interconnects and flip chip interconnects are formed as needed between each pair of communication edges to achieve the electrical connections required by the active or IP circuitry on each adjacent die, the wiring pattern exhibited by the various wire bond interconnects and flip chip interconnects may be any wiring pattern and may exhibit the characteristics discussed above, such as wire bond interconnects and flip chip interconnects formed between adjacent or non-adjacent pads, some wire bonding pads lacking any wire bond, de-populated areas located among wire bonding pads and flip chip bumped bonding pads, and non-equal numbers of wire bonding pads and flip chip bumped bonding pads on adjacent communication edges. It is also noted that some wire bonding interconnects may cross other wire bonding interconnects, such as interconnect 1765 crossing over (and having a greater total height than) interconnect 1760.

Further, while the embodiment in FIG. 17 illustrates "first order" wire bonding interconnects between die 1705 and each die 1710, other embodiments may further include "second order" wire bonding interconnects between one or more die 1710 and additional die, according to the present disclosure provided above. For example, die 1710(1) may further include a second communication edge that in turn is connected to another die by a second set of wire bonding interconnects. Similarly, while the disclosure provided above in connection with FIG. 16A-16H discusses other embodiments including "first order" flip chip interconnects between die 1705 and each die 1710, additional embodiments may further include "second order" flip chip interconnects between one or more die 1710 and additional die according to the present disclosure.

It is noted that the die that are interconnected may be differently sized in different embodiments, such as die 1710(1)-(4) all being smaller than die 1705. Each communication edge may also be similarly or differently sized in different embodiments, such as where communication edge 1750 is substantially the same size as communication edge 1730, or where communication edge 1755 is smaller than edge 1735. Each die may also be similarly or differently shaped in different embodiments, such as die 1710(1)-(4) all being similarly rectangular in FIG. 17, or each die being one of a different shape as further discussed below in connection with FIG. 18.

Figure 18:
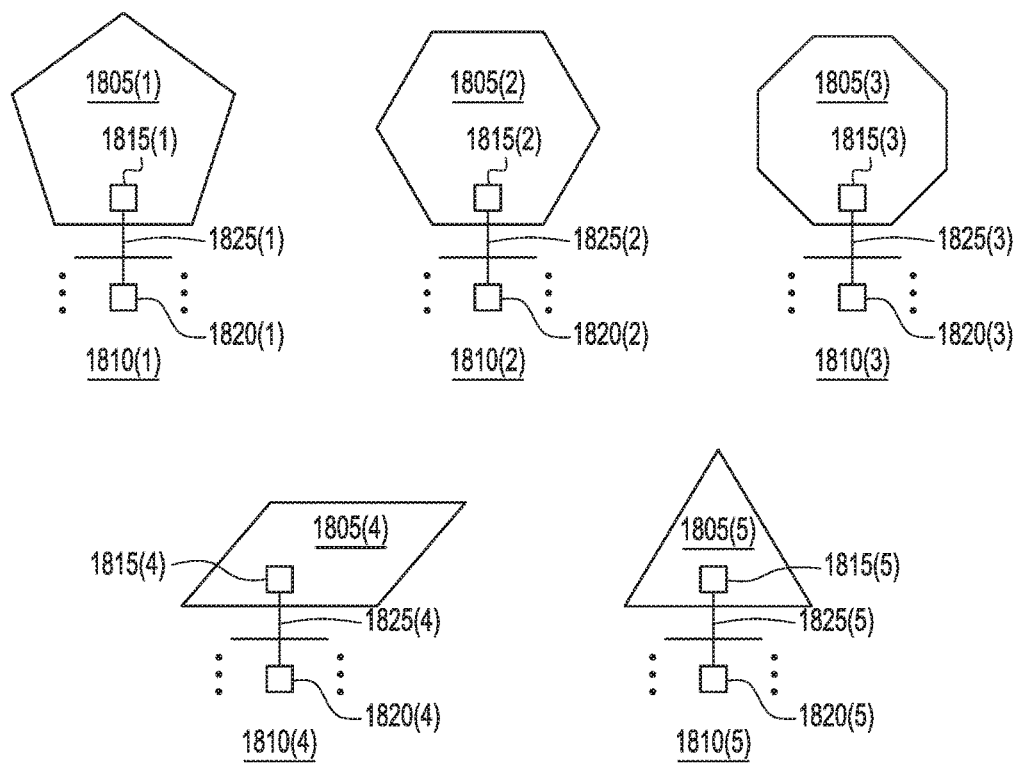
FIG. 18 illustrates block diagrams depicting different shapes of multiple sided die, according to some embodiments of the present disclosure.

FIG. 18 shows top down views of examples of differently shaped multi-sided die, or die having multiple sides. At least one communication edge of each die is illustrated in the example views, where each various die has one or more communication edge. Each die 1805 is shown as a polygon having a different number of sides. At least one wire bonding pad 1815 is illustrated on a communication edge of the die 1805, which is connected by a wire bond 1825 to another wire bonding pad 1820 on an adjacent communication edge of another die 1810, which may also be one of the various polygonal shapes shown in FIG. 18 or other shape. Each die 1805 and 1810 include one or more communication edges. The combination of the wire bond 1825, wire bonding pad 1815, and wire bonding pad 1820 may also be referred to as a wire bond interconnect 1825.

Die 1805(1) is shown as having five sides (e.g., pentagon), die 1805(2) is shown as having six sides (e.g., hexagon), die 1805(3) is shown as having eight sides (e.g., octagon), die 1805(4) is shown as having four sides and angles different than ninety degrees (e.g., parallelogram, although other quadrilaterals having different internal angles may be used, such as squares, rectangles, rhombuses, and the like), and die 1805(5) is shown as having three sides (e.g., triangle).

By now it should be appreciated that there has been provided embodiments of a semiconductor packaged device, and method of making thereof, that includes forming interconnects between two or more adjacent flip chip die, where the interconnects include one or more wire bond interconnects, one or more flip chip interconnects, or both.

In one embodiment of the present disclosure, a semiconductor packaged device is provided, which includes: a substrate; a first flip chip die mounted to a first major surface of the substrate; a second flip chip die mounted to the first major surface of the substrate, the second flip chip die laterally adjacent to the first flip chip die on the first major surface; and a wire bond formed between a first bond pad on the first flip chip die and a second bond pad on the second flip chip die.

One aspect of the above embodiment provides that the wire bond does not contact the first major surface of the substrate.

Another aspect of the above embodiment provides that the first flip chip die has a first active side that is mounted to the first major surface of the substrate, the second flip chip die has a second active side that is mounted to the first major surface of the substrate, the first bond pad is located on the first active side, and the second bond pad is located on the second active side.

A further aspect of the above embodiment provides that the semiconductor packaged device further includes: a plurality of flip chip bumps joined to pads on the first active side of the first flip chip die and to pads on the first major surface of the substrate.

Another aspect of the above embodiment provides that the semiconductor packaged device further includes: a flip chip interconnect formed in substrate layers of the substrate between a first flip chip bump joined to the first flip chip die and a second flip chip bump joined to the second flip chip die.

Another aspect of the above embodiment provides that the semiconductor packaged device further includes: a ground plane formed in substrate layers of the substrate in close proximity to the wire bond.

Another aspect of the above embodiment provides that the semiconductor packaged device further includes: a carrier attached to a back side of the first flip chip die and to a back side of the second flip chip die.

A further aspect of the above embodiment provides that the semiconductor packaged device further includes: encapsulant material that contacts at least the first major surface of the substrate, the first active side, and the second active side, and surrounds the wire bond.

Another aspect of the above embodiment provides that the semiconductor packaged device further includes: a third flip chip die mounted to the first major surface of the substrate, the third flip chip die laterally adjacent to the first flip chip die on the first major surface; and a second wire bond formed between a third bond pad on the first flip chip die and a fourth bond pad on the third flip chip die.

In another embodiment of the present disclosure, a semiconductor packaged device is provided, the device includes: a first die having a first active side, a first communication edge, and a first plurality of wire bonding pads located on the first active side near the first communication edge; a second die having a second active side, a second communication edge, and a second plurality of wire bonding pads located on the second active side near the second communication edge, the second communication edge in close proximity to and adjacent to the first communication edge; a plurality of wire bond interconnects formed between ones of the first plurality of wire bonding pads and ones of the second plurality of wire bonding pads; and a plurality of flip chip bumps each joined to bonding pads on the first and second active sides.

One aspect of the above embodiment provides that the semiconductor packaged device further includes: a substrate having a first major surface, wherein the plurality of flip chip bumps are further joined to contact pads on the first major surface.

A further aspect of the above embodiment provides that the semiconductor packaged device further includes: a plurality of flip chip interconnects formed in substrate layers of the substrate between ones of a first set of flip chip bumps joined to the first die and ones of a second set of flip chip bumps joined to the second die.

Another further aspect of the above embodiment provides that the semiconductor packaged device further includes: a ground plane formed in substrate layers of the substrate in close proximity to the plurality of wire bond interconnects.

Another aspect of the above embodiment provides that the semiconductor packaged device further includes: a carrier attached to a back side of the first die and to a back side of the second die.

Another aspect of the above embodiment provides that the semiconductor packaged device further includes: a third communication edge on either the first die or the second die, the third communication edge having a third plurality of wire bonding pads; a fourth communication edge on a third die, the fourth communication edge having a fourth plurality of wire bonding pads, the fourth communication edge in close proximity to and adjacent to the third communication edge; and a second plurality of wire bond interconnects formed between ones of the third plurality of wire bonding pads and ones of the fourth plurality of wire bonding pads.

In another embodiment of the present disclosure, a method for making a semiconductor packaged device having high density interconnections is provided, the method includes: forming a plurality of wire bonds between ones of a first plurality of wire bonding pads on an active side of a first die and ones of a second plurality of wire bonding pads on an active side of a second die, wherein the active sides of the first and second die each further include a plurality of bumped bonding pads having attached flip chip bumps, and a height of each of the plurality of wire bonds is less than a height of each of the attached flip chip bumps; and mounting the active sides of the first die and the second die to a first major surface of a substrate, after the forming the plurality of wire bonds, wherein the mounting joins the flip chip bumps to contact pads on the first major surface.

One aspect of the above embodiment provides that the method further includes: dispensing an encapsulant material to contact the active sides of the first and second die, the first major surface of the substrate, the flip chip bumps, and the plurality of wire bonds.

Another aspect of the above embodiment provides that the method further includes: prior to forming the plurality of wire bonds, attaching a back side of the first die and a back side of the second die to a carrier.

A further aspect of the above embodiment provides that the method further includes: after the mounting the active sides of the first and second die to the first major surface of the substrate, removing the carrier from the back sides of the first die and second die.

Another aspect of the above embodiment provides that the substrate includes one or more of: a plurality of flip chip interconnects formed between ones of a set of flip chip bumps joined to the first die and ones of a set of flip chip bumps joined to the second die, wherein the plurality of flip chip interconnects are formed in substrate layers, and a ground plane located in close proximity to the plurality of wire bonds.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

As used herein, the terms "substantial" and "substantially" mean sufficient to accomplish the stated purpose in a practical manner and that minor imperfections, if any, are not significant for the stated purpose. When used in regards to dimensional values of semiconductor components, such as one value being "substantially the same as" another value or the values being "substantially similar", the term "substantially" means that the values have numerical values, as compared with one another, that fall within some window of tolerance, taking into account any minor deviations that arise from usual and expected process abnormalities that may occur during the wafer fabrication and packaging processes described above.

Although the invention is described herein with reference to specific embodiments, various modifications and changes can be made without departing from the scope of the present invention as set forth in the claims below. For example, different wiring patterns may be implemented in the semiconductor device of FIG. 5, including fewer or additional bond pads and fewer or additional wire bonds. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor packaged device comprising:
   a substrate;
   a first flip chip die having a first plurality of flip chip bumps mounted to a first major surface of the substrate, the first plurality of flip chip bumps having a uniform bump height measured from a respective bond pad on the first flip chip die to a top surface of each flip chip bump;
   a second flip chip die having a second plurality of flip chip bumps mounted to the first major surface of the substrate, the second plurality of flip chip bumps having the uniform bump height measured from a respective bond pad on the second flip chip die to a top surface of each flip chip bump, the second flip chip die laterally adjacent to the first flip chip die on the first major surface; and
   a wire bond interconnect formed as a wire between a first bond pad on the first flip chip die and a second bond pad on the second flip chip die, each end of the wire having a bond respectively connected to the first and second bond pads, the wire bond interconnect having a loop height measured from a respective bond pad to an apex of the wire bond interconnect, the loop height has a smaller value than the uniform bump height.

2. The semiconductor packaged device of claim 1, wherein the wire bond interconnect does not contact the first major surface of the substrate.

3. The semiconductor packaged device of claim 1, wherein
   the first plurality of flip chip bumps are joined to bond pads on a first active side of the first flip chip die,
   the second plurality of flip chip bumps are joined to bond pads on a second active side of the second flip chip die,
   the first bond pad is located on the first active side, and
   the second bond pad is located on the second active side.

4. The semiconductor packaged device of claim 3, further comprising:
   the first plurality of flip chip bumps and the second plurality of flip chip bumps are further joined to contact pads on the first major surface of the substrate.

5. The semiconductor packaged device of claim 1, further comprising:
   a flip chip interconnect formed in substrate layers of the substrate between a first flip chip bump joined to the first flip chip die and a second flip chip bump joined to the second flip chip die.

6. The semiconductor packaged device of claim 1, further comprising:
   a ground plane formed in substrate layers of the substrate in close proximity to the wire bond interconnect.

7. The semiconductor packaged device of claim 1, further comprising:
   a carrier attached to a back side of the first flip chip die and to a back side of the second flip chip die.

8. The semiconductor packaged device of claim 3, further comprising:
   encapsulant material that contacts at least the first major surface of the substrate, the first active side, and the second active side, and surrounds the wire bond interconnect.

9. The semiconductor packaged device of claim 1, further comprising:
   a third flip chip die mounted to the first major surface of the substrate, the third flip chip die laterally adjacent to the first flip chip die on the first major surface; and
   a second wire bond interconnect formed between a third bond pad on the first flip chip die and a fourth bond pad on the third flip chip die.

10. A semiconductor packaged device comprising:
    a first die having a first active side, a first communication edge, and a first plurality of wire bonding pads located on the first active side near the first communication edge;
    a second die having a second active side, a second communication edge, and a second plurality of wire bonding pads located on the second active side near the second communication edge, the second communication edge in close proximity to and adjacent to the first communication edge;
    a plurality of wire bond interconnects formed between ones of the first plurality of wire bonding pads and ones of the second plurality of wire bonding pads, the plurality of wire bond interconnects each having a loop height measured from a respective bonding pad to an apex of each wire bond interconnect; and
    a plurality of flip chip bumps each joined to bonding pads on the first and second active sides, the plurality of flip chip bumps having a uniform bump height measured from a respective bonding pad to a top surface of each flip chip bump, wherein each loop height has a smaller value than the uniform bump height.

11. The semiconductor packaged device of claim 10, further comprising:
a substrate having a first major surface, wherein the plurality of flip chip bumps are further joined to contact pads on the first major surface.

12. The semiconductor packaged device of claim 11, further comprising:
a plurality of flip chip interconnects formed in substrate layers of the substrate between ones of a first set of flip chip bumps joined to the first die and ones of a second set of flip chip bumps joined to the second die.

13. The semiconductor packaged device of claim 11, further comprising:
a ground plane formed in substrate layers of the substrate in close proximity to the plurality of wire bond interconnects.

14. The semiconductor packaged device of claim 10, further comprising:
a carrier attached to a back side of the first die and to a back side of the second die.

15. The semiconductor packaged device of claim 10, further comprising:
a third communication edge on either the first die or the second die, the third communication edge having a third plurality of wire bonding pads;
a fourth communication edge on a third die, the fourth communication edge having a fourth plurality of wire bonding pads, the fourth communication edge in close proximity to and adjacent to the third communication edge; and
a second plurality of wire bond interconnects formed between ones of the third plurality of wire bonding pads and ones of the fourth plurality of wire bonding pads.

16. A method for making a semiconductor packaged device having high density interconnections, the method comprising:
forming a plurality of wire bond interconnects, using a wire bonding tool, between ones of a first plurality of wire bonding pads on an active side of a first die and ones of a second plurality of wire bonding pads on an active side of a second die, wherein the active sides of the first and second die each further include a plurality of bumped bonding pads having attached flip chip bumps,
each of the attached flip chip bumps has a uniform bump height measured from a respective bonding pad to a top surface of each flip chip bump, and
each of the plurality of wire bond interconnects has a loop height measured from a respective bonding pad to an apex of the wire bond interconnect, each loop height has a smaller value than the uniform bump height of each of the attached flip chip bumps; and
mounting the active sides of the first die and the second die to a first major surface of a substrate, after the forming the plurality of wire bond interconnects, wherein the mounting joins the flip chip bumps to contact pads on the first major surface and the wire bond interconnects do not contact the first major surface.

17. The method of claim 16, further comprising:
dispensing an encapsulant material to contact the active sides of the first and second die, the first major surface of the substrate, the flip chip bumps, and the plurality of wire bond interconnects.

18. The method of claim 16, further comprising:
prior to forming the plurality of wire bond interconnects, attaching a back side of the first die and a back side of the second die to a carrier.

19. The method of claim 18, further comprising:
after the mounting the active sides of the first and second die to the first major surface of the substrate, removing the carrier from the back sides of the first die and second die.

20. The method of claim 16, wherein the substrate comprises one or more of:
a plurality of flip chip interconnects formed between ones of a set of flip chip bumps joined to the first die and ones of a set of flip chip bumps joined to the second die, wherein the plurality of flip chip interconnects are formed in substrate layers, and
a ground plane located in close proximity to the plurality of wire bond interconnects.

* * * * *